US009079434B2

(12) United States Patent
Kamiya et al.

(10) Patent No.: US 9,079,434 B2
(45) Date of Patent: Jul. 14, 2015

(54) CIRCUIT BOARD UNIT, CARTRIDGE, AND MANUFACTURING METHOD THEREOF

(71) Applicant: Brother Kogyo Kabushiki Kaisha, Nagoya-shi, Aichi-ken (JP)

(72) Inventors: Masataka Kamiya, Owariasahi (JP); Noritsugu Ito, Tokoname (JP); Hitoshi Yamamoto, Gifu (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 124 days.

(21) Appl. No.: 13/629,896

(22) Filed: Sep. 28, 2012

(65) Prior Publication Data

US 2013/0083499 A1 Apr. 4, 2013

(30) Foreign Application Priority Data

Sep. 30, 2011 (JP) ................................ 2011-218542

(51) Int. Cl.
*H05K 7/20* (2006.01)
*B41J 13/10* (2006.01)
*H01L 23/473* (2006.01)

(52) U.S. Cl.
CPC .......... *B41J 13/103* (2013.01); *Y10T 29/49124* (2015.01); *Y10T 156/10* (2015.01)

(58) Field of Classification Search
CPC ........... H05K 7/20218–7/20381; H01L 23/473
USPC ............... 361/736–759, 760, 679.46–679.54, 361/688–727; 174/260–262
See application file for complete search history.

(56) References Cited

U.S. PATENT DOCUMENTS

| | | | | |
|---|---|---|---|---|
| 6,166,908 | A * | 12/2000 | Samaras et al. | 361/700 |
| 6,628,529 | B2 * | 9/2003 | Takamoto et al. | 361/800 |
| 7,019,392 | B2 * | 3/2006 | Iwasaki | 257/679 |
| 7,048,564 | B1 * | 5/2006 | Hinze | 439/276 |
| 7,149,089 | B2 * | 12/2006 | Blasko et al. | 361/752 |
| 7,286,338 | B2 * | 10/2007 | Yamashita | 361/622 |
| 7,289,337 | B2 * | 10/2007 | Lavergne et al. | 361/804 |
| 7,375,278 | B2 * | 5/2008 | Kaply et al. | 174/50 |
| 7,433,203 | B1 * | 10/2008 | Yi et al. | 361/800 |
| 2001/0009507 | A1 * | 7/2001 | Washino et al. | 361/752 |
| 2003/0090880 | A1 * | 5/2003 | Wang et al. | 361/736 |
| 2006/0077640 | A1 * | 4/2006 | Yoshikawa et al. | 361/752 |
| 2006/0133051 | A1 * | 6/2006 | Calvas et al. | 361/752 |
| 2007/0222838 | A1 | 9/2007 | Wanibe | |

(Continued)

FOREIGN PATENT DOCUMENTS

| | | | |
|---|---|---|---|
| JP | 4281815 | B2 | 6/2009 |
| JP | 2009-214506 | A | 9/2009 |

*Primary Examiner* — Anthony Haughton
*Assistant Examiner* — Razmeen Gafur
(74) *Attorney, Agent, or Firm* — Baker Botts L.L.P.

(57) ABSTRACT

A circuit board unit which is attached to the cartridge includes a circuit board on which an electronic component is mounted, a first member having a surface opposing the circuit board, and a second member which is bonded to a region of the surface of the first member which region is different from the region of the surface opposing the circuit board. The circuit board is not fixed to the first member and the second member and is retained between the first member and the second member with gaps extending in an orthogonal direction orthogonal to the surface and in a surface direction in parallel to the surface.

17 Claims, 23 Drawing Sheets

(56) References Cited

U.S. PATENT DOCUMENTS

| | | | | |
|---|---|---|---|---|
| 2008/0158829 | A1 * | 7/2008 | Wakabayashi et al. | 361/719 |
| 2008/0214302 | A1 * | 9/2008 | Nagano | 463/31 |
| 2010/0110647 | A1 * | 5/2010 | Hiew et al. | 361/752 |
| 2010/0265677 | A1 * | 10/2010 | Lin et al. | 361/752 |
| 2010/0315753 | A1 * | 12/2010 | Mosesian et al. | 361/104 |
| 2011/0103837 | A1 * | 5/2011 | Toyoda et al. | 399/174 |
| 2011/0198391 | A1 * | 8/2011 | Stidham et al. | 228/198 |
| 2013/0025831 | A1 * | 1/2013 | Attinger et al. | 165/104.27 |

* cited by examiner 140
145
143
ⅧA
143f
143y
ⅧB
144
143x
141
142
170c～177c 143
143a
143x
143z
143f
143y 144
144a
144x
144b 140
144
141
143
143z
143y
145

143
143f
143z
143y 144
144a
144x
144b

CIRCUIT BOARD UNIT, CARTRIDGE, AND MANUFACTURING METHOD THEREOF

CROSS REFERENCE TO RELATED APPLICATION

The present application claims priority from Japanese Patent Application No. 2011-218542, which was filed on Sep. 30, 2011, the disclosure of which is herein incorporated by reference in its entirety.

BACKGROUND OF THE INVENTION

1. Field of the Invention

The present invention relates to a circuit board unit including a circuit board on which an electronic component is mounted, a cartridge, and a method of manufacturing them.

2. Description of the Related Art

A technology concerning a circuit board attached to a cartridge is such that a circuit board on which an electronic component (such as a memory and one or more terminals) is mounted is attached to a cartridge (container main body) while the circuit board is fixed to a circuit board attaching member. The circuit board has a notch and a through hole, and the leading end of a protrusion of a circuit board attaching member is molten and thermally caulked after the protrusion is inserted into the notch and the through hole, with the result that the circuit board is fixed to the circuit board attaching member.

SUMMARY OF THE INVENTION

The technology above, however, is disadvantageous in that because the circuit board is fixed to the circuit board attaching member, the part of the circuit board at which the circuit board is fixed to the circuit board attaching member (i.e., the joint subjected to the thermal caulking) inevitably receives stress (jointing stress). This may deteriorate the circuit board and the electronic component mounted thereon. For example, the circuit board is deformed by the stress and the soldered memory and one or more terminals drop off from the circuit board.

An object of the present invention is the provide a circuit board unit and a cartridge that are capable of restraining the degradation of a circuit board and an electronic component mounted on the circuit board, and a method of manufacturing them.

According to the first aspect of the present invention, there is provided a circuit board unit attachable to a cartridge including: a circuit board on which an electronic component is mounted; a first member having a surface opposing the circuit board; and a second member which is bonded to a region of the surface, the region being different from a region of the surface opposing the circuit board, the circuit board being not fixed to the first member and the second member and being retained between the first member and the second member with gaps extending in an orthogonal direction orthogonal to the surface and in a surface direction in parallel to the surface.

According to the second aspect of the present invention, there is provided a method of manufacturing a circuit board unit attachable to a cartridge, including the steps of: (i) moving a circuit board, on which an electronic component is mounted, to oppose a surface of the first member, and mounting the circuit board on the surface; and (ii) after the step (i), bonding a second member to a region of the surface, the region being different from a region of the surface opposing the circuit board, in the step (ii), the circuit board being retained between the first member and the second member with gaps extending in an orthogonal direction orthogonal to the surface and in a surface direction in parallel to the surface.

According to the third aspect of the present invention, there is provided a cartridge including: a housing that stores liquid; and the circuit board unit according to the first aspect attached to the housing, the housing having a groove that receives an outer periphery of the first member in the surface direction and including a first housing and a second housing which is attached to the first housing so as to define a space for storing liquid with the first housing, a first groove which is a part of the groove being formed on the first housing, and a second groove which is a part of the groove different from the first groove being formed on the second housing.

According to the fourth aspect of the present invention, there is provided a method of manufacturing a cartridge, the cartridge including: and the circuit board unit according to the first aspect attached to the housing, the housing having a groove that receives an outer periphery of the first member in the surface direction, and including a first housing and a second housing which is attached to the first housing so as to define a space for storing liquid with the first housing, a first groove which is a part of the groove being formed on the first housing, and a second groove which is apart of the groove different from the first groove being formed on the second housing, the method comprising the steps of: (I) causing apart of the outer periphery of the first member to be received by the first groove of the first housing; and (II) after the step (I), attaching the second housing to the first housing and causing parts of the outer periphery of the first member other than the part received by the first groove to be received by the second groove of the second housing.

According to the fifth aspect of the present invention, there is provided a cartridge attachable to a recording apparatus, including: a housing that stores liquid; a circuit board on which an electronic component is mounted, the circuit board having a first surface on which a terminal electrically connected to the electronic component arc provided and being attached to a surface of the housing to expose the terminal; a cover that has an opposing surface opposing a part of the first surface of the circuit board in a thickness direction of the circuit board; and a regulating wall that regulates the movement of the circuit board in a first direction orthogonal to the thickness direction, the distance between the opposing surface of the cover and the surface of the housing in the thickness direction being longer than the thickness of the circuit board, and the regulating wall regulating the movement of the circuit board in the first direction so that the part of the first surface of the circuit board opposes the opposing surface while the terminal is exposed without opposing the opposing surface.

According to the sixth aspect of the present invention, there is provided a method of manufacturing a cartridge attachable to a recording apparatus, including the steps of: (1) providing a circuit board, on which an electronic component is mounted and which has a surface on which a terminal electrically connected to the electronic component is provided, on a surface of a housing storing liquid such that the movement of the circuit board in one direction orthogonal to the thickness direction of the circuit board is regulated by a regulating wall which is formed as a part of the housing; and (2) after the step (1), fixing a cover, which has an opposing surface that opposes the surface of the circuit board in the thickness direction, to the surface of the housing, in the step (2), the distance between the opposing surface of the cover and the surface of the housing in the thickness direction being arranged to be longer than the thickness of the circuit board while a part of the surface of the circuit board opposes the opposing surface and the terminal is exposed without opposing the opposing surface.

According to the seventh aspect of the invention, there is provided a cartridge attachable to a recording apparatus including: a housing that defines a housing space; a circuit hoard on which an electronic component is mounted, the circuit board having a circuit surface on which one or more terminals electrically connected to the electronic component are provided and being attached to a surface of the housing to expose the one or more terminals; a cover that has an opposing surface opposing a part of the terminal surface of the circuit board in a thickness direction of the circuit board; and a wall that regulates the movement of the circuit board in a first direction orthogonal to the thickness direction, the distance between the opposing surface of the cover and the surface of the housing in the thickness direction being longer than the thickness of the circuit board, and $Kx-Sx<cx<ax$ and $Kx-Sx<dx<bx$ holding, provided that a movable range of the circuit board in the first direction, which is defined by the wall, is Kx, the length of the circuit board in the first direction is Sx, the distance between a terminal which is closest to one edge of the circuit board in the first direction among the one or more terminals and the one edge is ax, the distance between a terminal which is closest to the other edge of the circuit board in the first direction among the one or more terminals and the other edge is bx, the length in the first direction of a first region of the opposing surface that region is continuous from the one edge of the circuit board and opposes a part of the terminal surface is cx, and the length in the first direction of a second region of the opposing surface that region is continuous from the other edge of the circuit board and opposes a part of the terminal surface is dx.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS (First Embodiment)

To begin with, referring to FIG. 1, the overall structure of an inkjet printer 1 including a circuit board unit and a cartridge according to an embodiment of the present invention will be described.

The printer 1 has a rectangular parallelepiped housing 1*a*. Above the top plate of a housing 1*a* is provided a sheet discharge section 31. On the front of the housing 1*a* (i.e., the lower left surface in FIG. 1), three openings 10*d*, 10*b*, and 10*c* are formed from top to bottom. The opening 10*b* is used for inserting a sheet supply unit 1*b* into the housing 1*a* and the opening 10*c* is used for inserting a cartridge 40 (see FIG. 2) into the housing 1*a*. To the opening 10*d* is fitted a door 1*d* which is openable about a horizontal shaft at the lower end. The door 1*d* is provided to oppose a conveying unit 21 (see FIG. 2) in the main scanning direction of the housing 1*a* (i.e., the direction orthogonal to the front surface of the housing 1*a*). To the opening 10*c* is fitted a cover 1*c* that is openable about a horizontal shaft at the lower end. As the cover 1*c* is closed after the cartridge 40 is inserted into the housing 1*a*, it is possible to prevent the cartridge 40 from dropping off from the housing 1*a*.

Figure 2:
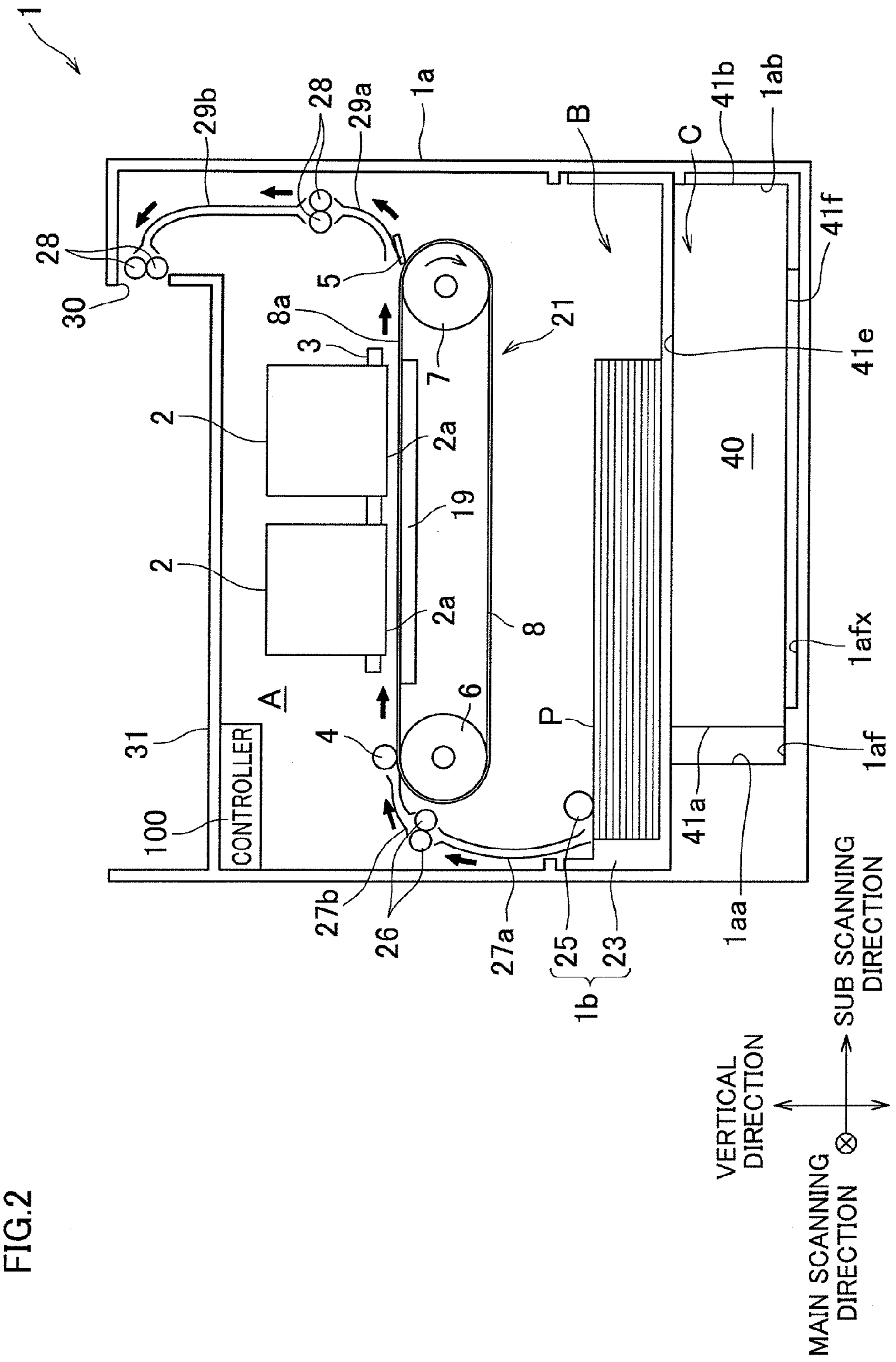
FIG. 2 is a schematic view of the internal structure of the printer of FIG. 1.

Now, referring to FIG. 2, the internal structure of the printer 1 will be described.

The internal space of the housing 1*a* is divided into spaces A, B, and C from top to bottom. In the space A are provided two heads 2 ejecting black ink and preprocessing liquid (hereinafter, these two may be generally termed "liquid"), respectively, a conveying unit 21 that conveys sheets P, and a controller 100 that controls the operations of the components of the printer 1. In the spaces B and C are provided a sheet supply unit 1*b* and cartridge 40, respectively. In other words, the space C is apart (attaching chamber) of the printer main body (i.e., parts of the printer 1 different from the cartridge 40), to which the cartridge 40 is attached. In the printer 1, a sheet conveyance path on which sheets P are conveyed is formed from the sheet supply unit 1*b* toward the sheet discharge section 31, along thick arrows in FIG. 2.

The controller 100 includes components such as a ROM (Read Only Memory), a RAM (Random Access Memory including nonvolatile RAM), and an I/F (Interface), in addition to a CPU (Central Processing Unit) which is a processing unit. The ROM stores programs executed by the CPU, various types of fixed data, or the like. The RAM is capable of temporarily storing data (such as image data) required for executing the programs. The controller 100 exchanges data with a memory 141 and a Hall effect sensor 71 of the cartridge 40 and with an external apparatus (e.g., a computer connected to the printer 1) via the I/F.

The sheet supply unit 1*b* includes a tray 23 and a roller 25. The tray 23 is detachable to the housing 1*a* in the main scanning direction. The tray 23 is an open-top box and capable of storing differently-sized sheets P. Under the control of the controller 100, the roller 25 is rotated by the pickup motor 125 (see FIG. 11) to send out the topmost sheet P in the tray 23. The sheet P sent out by the roller 25 is conveyed to the conveying unit 21 while being guided by guides 27*a* and 27*b* and. sandwiched by a feed roller pair 26.

The conveying unit 21 includes two rollers 6 and 7 and an endless conveyance belt 8 stretched around the rollers 6 and 7. The roller 7 which is a drive roller is driven by a conveyance motor 127 (see FIG. 11) connected to the shaft thereof and rotates clockwise in FIG. 2, under the control of the controller 100. The roller 6 which is a driven roller rotates clockwise in FIG. 2, as the conveyance belt 8 is moved by the rotation of the roller 7. In the space inside the conveyance belt 8, a rectangular parallelepiped platen 19 is provided to oppose the two heads 2. The upper part of the conveyance belt 8 is supported by the platen 19 from the inner circumferential surface in such a way that the outer circumferential surface 8*a* of the conveyance belt 8 is distanced for a predetermined distance from the lower surface 2*a* (ejection surface where a plurality of ejection openings ejecting liquid are formed) of the head 2 and extends in parallel to the lower surface 2*a*. On the outer circumferential surface 8*a* of the conveyance belt 8 is formed a weakly-adhesive silicon layer. The sheet P supplied from the sheet supply unit 1*b* to the conveying unit 21 is pressed onto the outer circumferential surface 8*a* of the conveyance belt 8 by the support roller 4, and is then conveyed in the sub-scanning direction along the thick arrows while being supported by the adhesive outer circumferential surface 8*a*.

It is noted that the sub-scanning direction is in parallel to the conveyance direction of the sheet P conveyed by the conveying unit 21. The main scanning direction is orthogonal to the sub-scanning direction and in parallel to the horizontal plane.

When the sheet P passes the position immediately below each head 2, the head 2 is driven under the control of the controller 100 and liquid (black ink or preprocessing liquid when necessary) is ejected from the lower surface 2*a* of the head 2 to the upper surface of the sheet P. with the result that a desired image is formed on the sheet P. The sheet P is then peeled off from the outer circumferential surface 8*a* of the conveyance belt 8 by the peeling plate 5, guided by the guides 29*a* and 29*b* and conveyed upward while being sandwiched between the two feed roller pairs 28, and is eventually ejected from an opening 130 formed at an upper part of the housing 1*a* to the sheet discharge section 31. One roller of each feed roller pair 28 is rotated by the feed motor 128 (see FIG. 11) under the control of the controller 100.

The preprocessing liquid is, for example, liquid for increasing the density (of the ink ejected onto the sheet P), for preventing ink bleeding and ink penetration (i.e., the ink ejected onto the surface of the sheet P penetrates the sheet P so as to reach the back surface), for improving the color development of ink and facilitating quick drying, and for restraining the sheet P from being wrinkled or curled after the ink ejection thereto. Examples of the preprocessing liquid include liquid including polyvalent metal salt such as cationic polymer and magnesium salt. The head 2 ejecting the preprocessing liquid is on the upstream of the head 2 ejecting the black ink in the conveyance direction of the sheet P.

Figure 1:
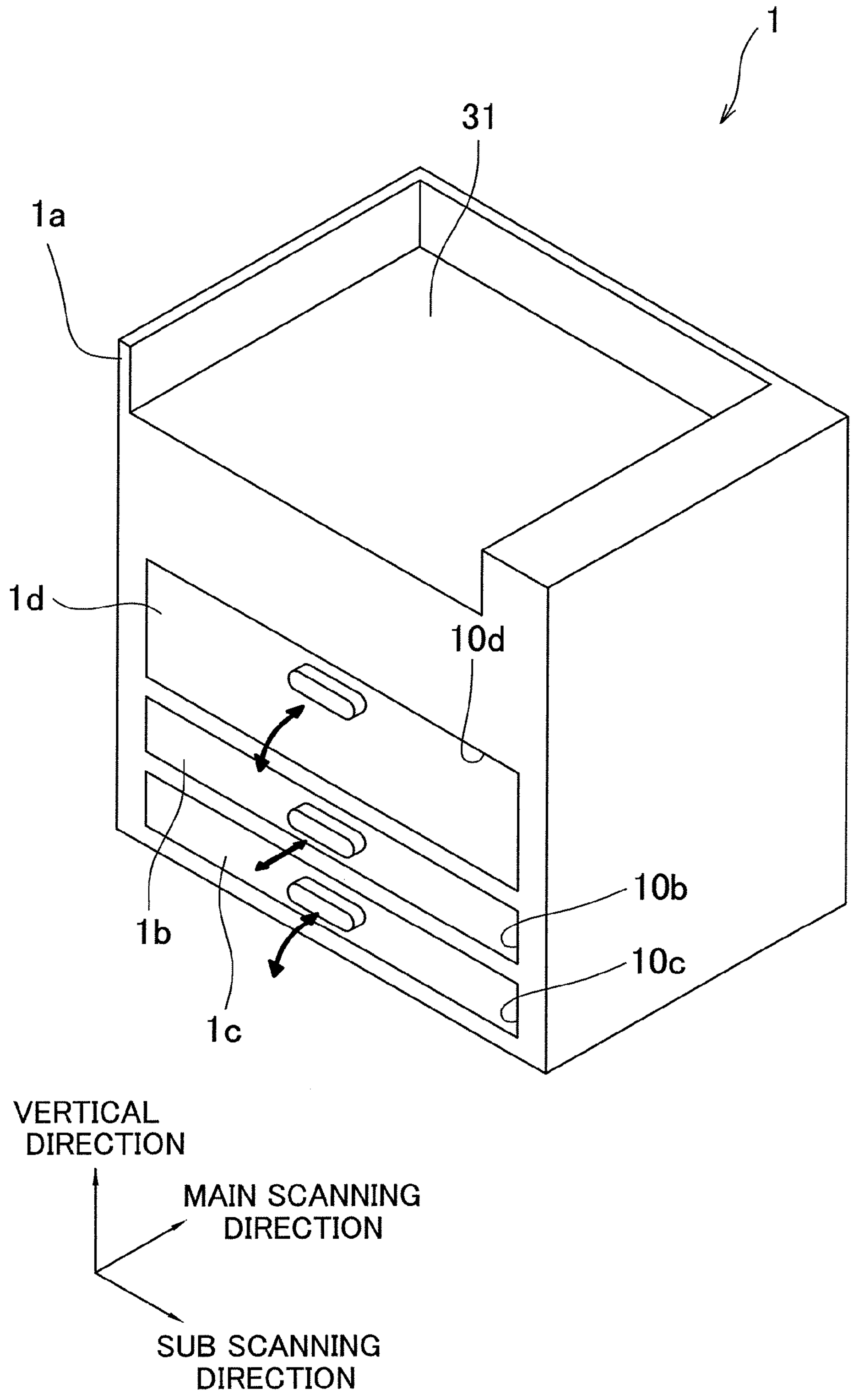
FIG. 1 is a perspective view of an inkjet printer including a circuit board unit and a cartridge according to an embodiment of the present invention.

Each head 2 is a line-type head which is elongated in the main scanning direction which is orthogonal to the plane of FIG. 1, and has a substantially rectangular parallelepiped outer shape. The two heads 2 are lined up in the sub-scanning direction with a predetermined distance therebetween and are supported by the housing 1*a* via the frame 3. In each head 2, joints to which flexible tubes are attached are provided on the upper surface, a plurality of ejection openings are formed on the lower surface 2*a*, and paths are formed inside each head 2 to allow liquid supplied from a corresponding reservoir 42 of the cartridge 40 to reach ejection openings via the flexible tube and the joint.

Figure 4:
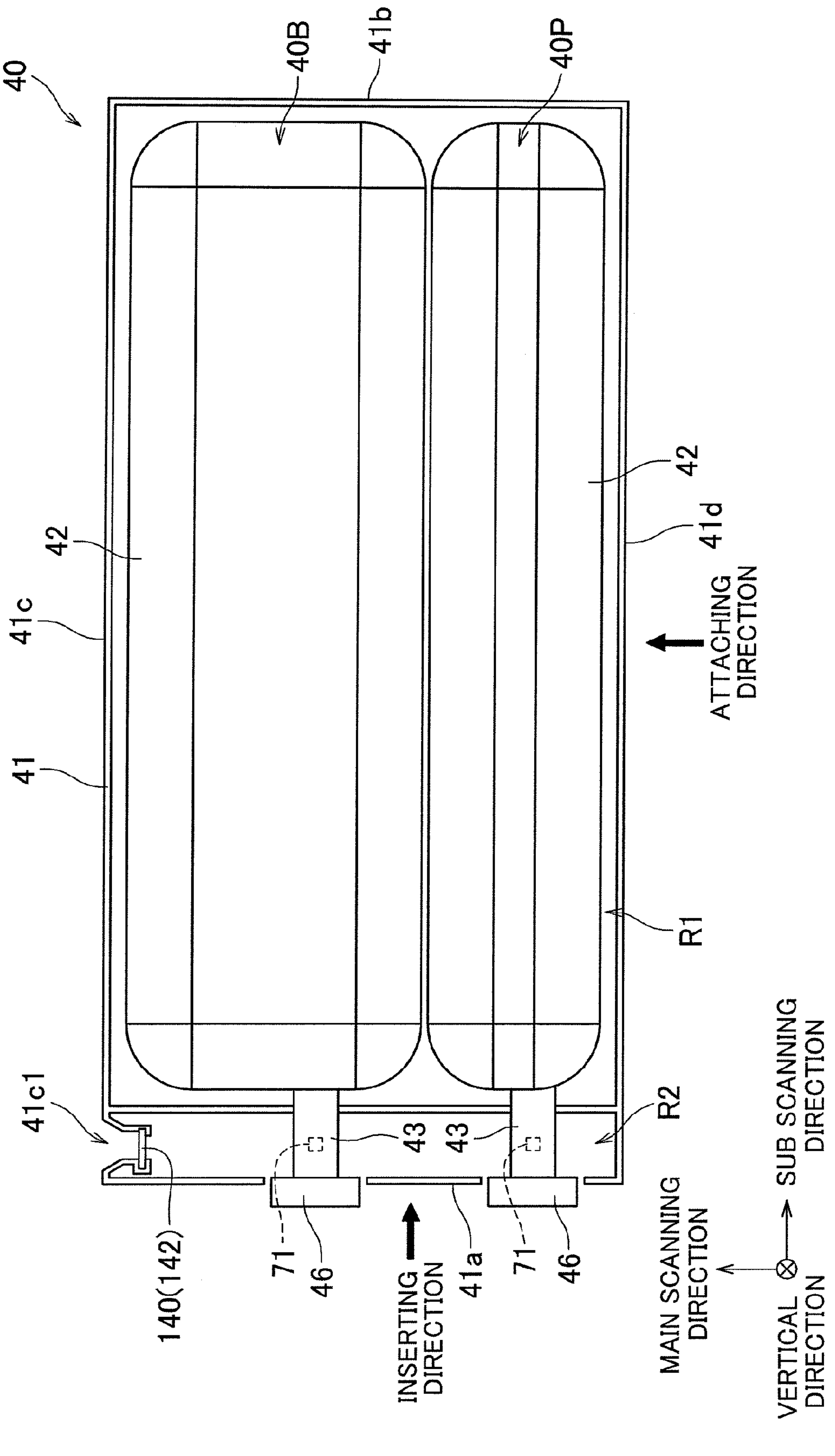
FIG. 4 is a schematic view of the internal structure of the cartridge.

The cartridge 40 has two reservoirs 42 that store black ink and preprocessing liquid, respectively (see FIG. 4). The two types of liquid stored in the respective reservoirs 42 of the cartridge 40 are supplied to the corresponding heads 2 via the flexible tubes and the joints. The cartridge 40 is arranged to be detachable to the housing 1*a* in the main scanning direction. This allows a user of the printer 1 to detach a used cartridge 40 from the housing 1*a* and attach a new cartridge 40 to the housing 1*a*.

Now, the structure of the cartridge 40 will be described.

Figure 3A:
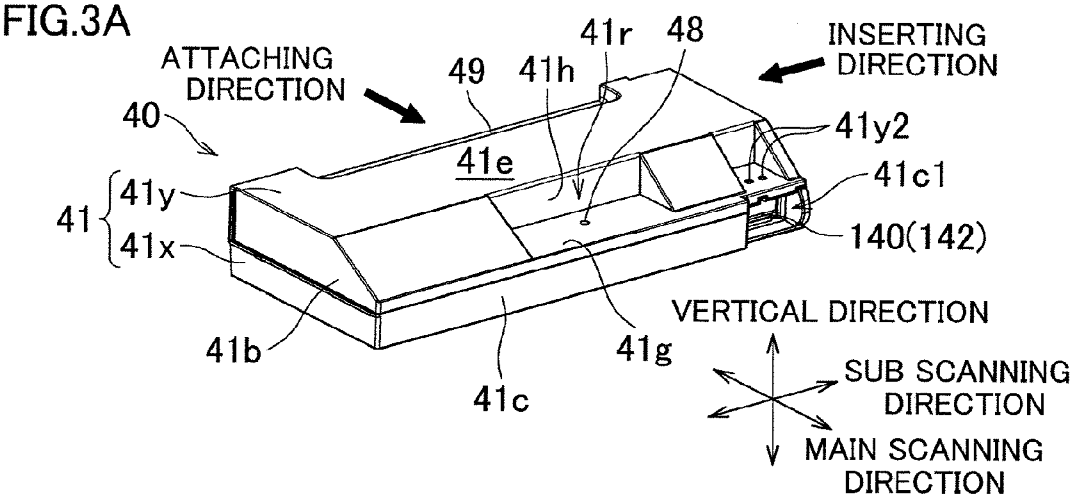
FIG. 3A and FIG. 3B are perspective views of a cartridge from different viewpoints.

As shown in FIG. 3A and FIG. 4, the cartridge 40 includes a housing 41, a black ink unit 40B corresponding to the black ink, a preprocessing liquid unit 40P corresponding to the preprocessing liquid, and a circuit board unit 140. Each of the units 40B and 40P includes the reservoir 42, an outlet pipe 43, or the like. These units are substantially identical with each other except the size of the reservoir 42.

Figure 3B:
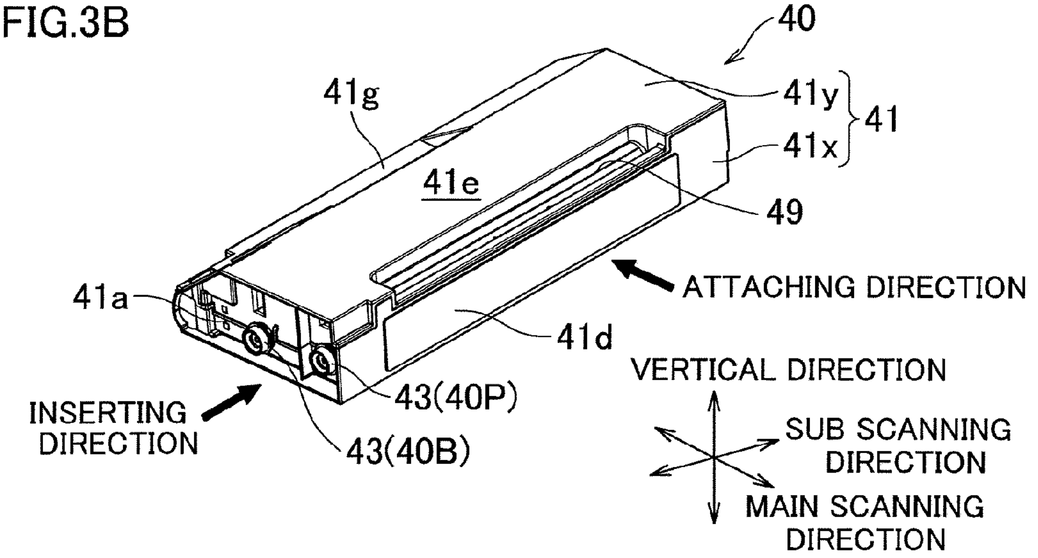
Figure 3C:
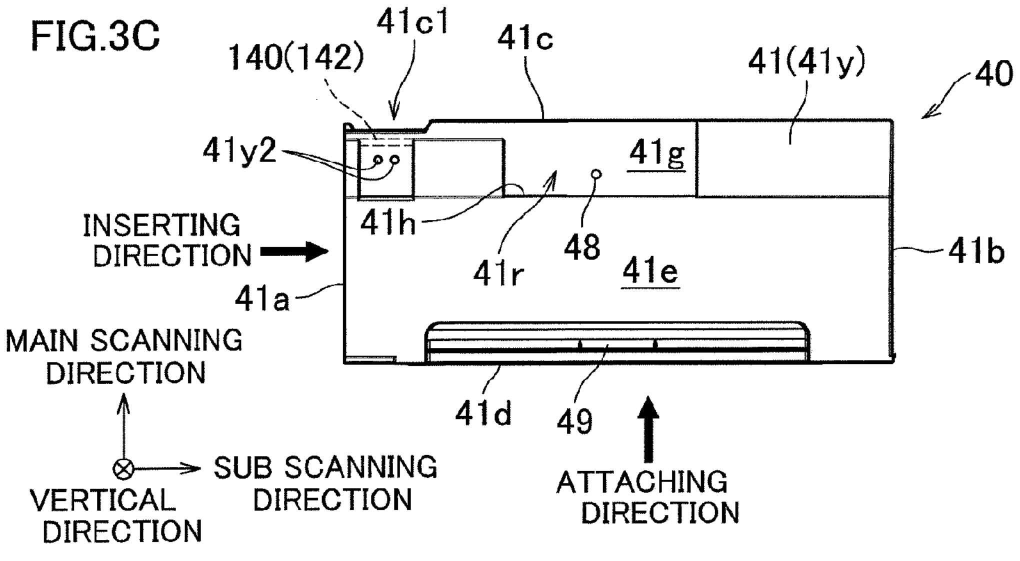
FIG. 3C is a plan view of the cartridge.

The housing 41 is substantially rectangular parallelepiped as shown in FIG. 3C and FIG. 4. The space inside the housing 41 is divided into two chambers R1 and R2 as shown in FIG. 4. In the right chamber R1 are provided the reservoirs 42 of the respective units 40B and 40P, whereas in the left chamber R2 are provided the outlet pipes 43 of the respective units 40B and 40P.

The reservoir 42 is a bag storing liquid. The reservoir 42 of the unit 40B stores the black ink whereas the reservoir 42 of the unit 40P stores the preprocessing liquid. To an opening of the reservoir 42 is connected the proximal end of the outlet pipe 43.

The outlet pipe 43 defines a path through which the liquid stored in the reservoir 42 is supplied to the head 2. As shown in FIG. 3B and FIG. 4, the leading end of the outlet pipe 43 protrudes to the outside of the housing 41. At this leading end, a compressed stopper made of an elastic material such as rubber is provided to close the opening opposite to the reservoir 42 (not illustrated). Outside the leading end and the stopper is provided a cap 46. The stopper is exposed through an opening formed at the center of the cap 46.

As shown in FIG. 3C and FIG. 4, the housing 41 is substantially rectangular parallelepiped and has outer surfaces 41*a* to 41*h* or the like. The outer surfaces 41*a* and 41*b* are both in parallel to an attaching direction (which is a direction in which the cartridge 40 moves with respect to the space C when the cartridge 40 is attached to the space C) and oppose each other over a space in an inserting direction (which is a direction in which a hollow needle 153 moves with respect to the outlet pipe 43 when the hollow needle 153 is inserted into the outlet pipe 43). On the outer surface 41*a* is provided the outlet pipe 43. The outer surfaces 41*c* and 41*d* are both substantially orthogonal to the attaching direction and substantially in parallel to the inserting direction. These surfaces are between the outer surfaces 41*a* and 41*b* in the inserting direction and oppose each other over a space in the attaching direction. The outer surface 41*c* is a leading end surface on the downstream in attaching direction, whereas the outer surface 41*d* is a rear end surface on the upstream in the attaching direction. The outer surfaces 41*e* and 41*f* (see FIG. 2) are both substantially orthogonal to the outer surfaces 41*a* to 41*d* and are between the outer surfaces 41*a* and 41*b* in the inserting direction and between the outer surfaces 41*c* and 41*d* in the attaching direction. The outer surfaces 41*e* and 41*f* are substantially in parallel to each other and oppose each other over a space in the vertical direction. The outer surface 41*g* is substantially in parallel to the outer surface 41*e* and is between the outer surfaces 41*e* and 41*f* in the vertical direction and between the outer surfaces 41*e* and 41*c* in the attaching direction. The outer surface 41*h* connects the outer surface 41*e* with the outer surface 41*g* and is substantially in parallel to the vertical direction.

In the present embodiment, the attaching direction is in parallel to the main scanning direction whereas the inserting direction is in parallel to the sub-scanning direction. The attaching direction and the inserting direction are orthogonal to each other.

Figure 10A:
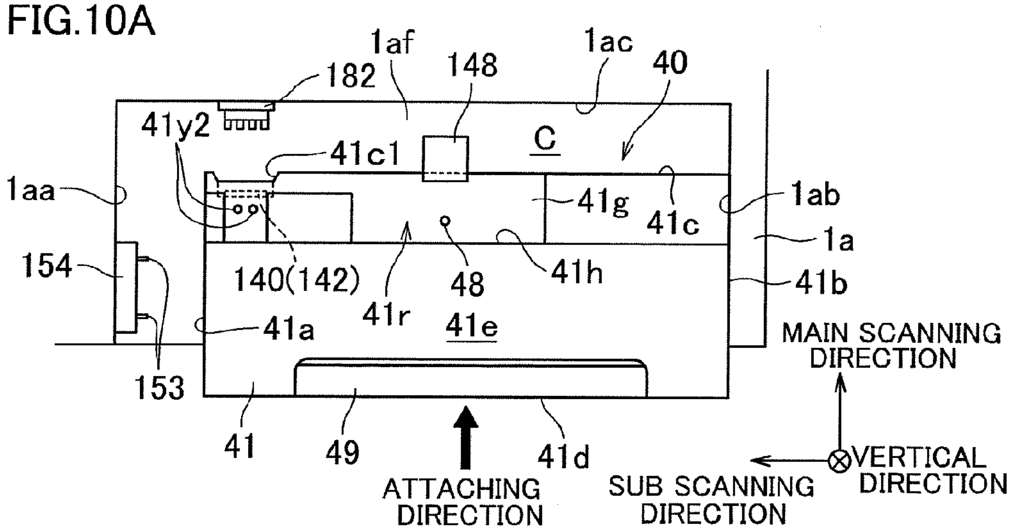
FIGS. 10A, 10B, and 10C schematically show how the cartridge is attached.

The housing 41 further includes a hole 48 used for fixing the housing 41 to the housing 1*a* when the cartridge 40 is attached to the space C, a concave portion 41*r* defined by the outer surfaces 41*g* and 41*h* or the like, and a grip 49 gripped by a user. The hole 48 is made through the outer surface 41*g* and is engaged with a fitting member 148 (see FIG. 10A) of the housing 1*a* when the cartridge 40 is attached to the space C. The grip 49 is a concave portion which is provided at the junction between the outer surfaces 41*e* and 41*d* and is long along the side of the outer surface 41*e* which is upstream in the attaching direction.

Figures 7A, 7B, 7C, 7D, 7E, 7F:
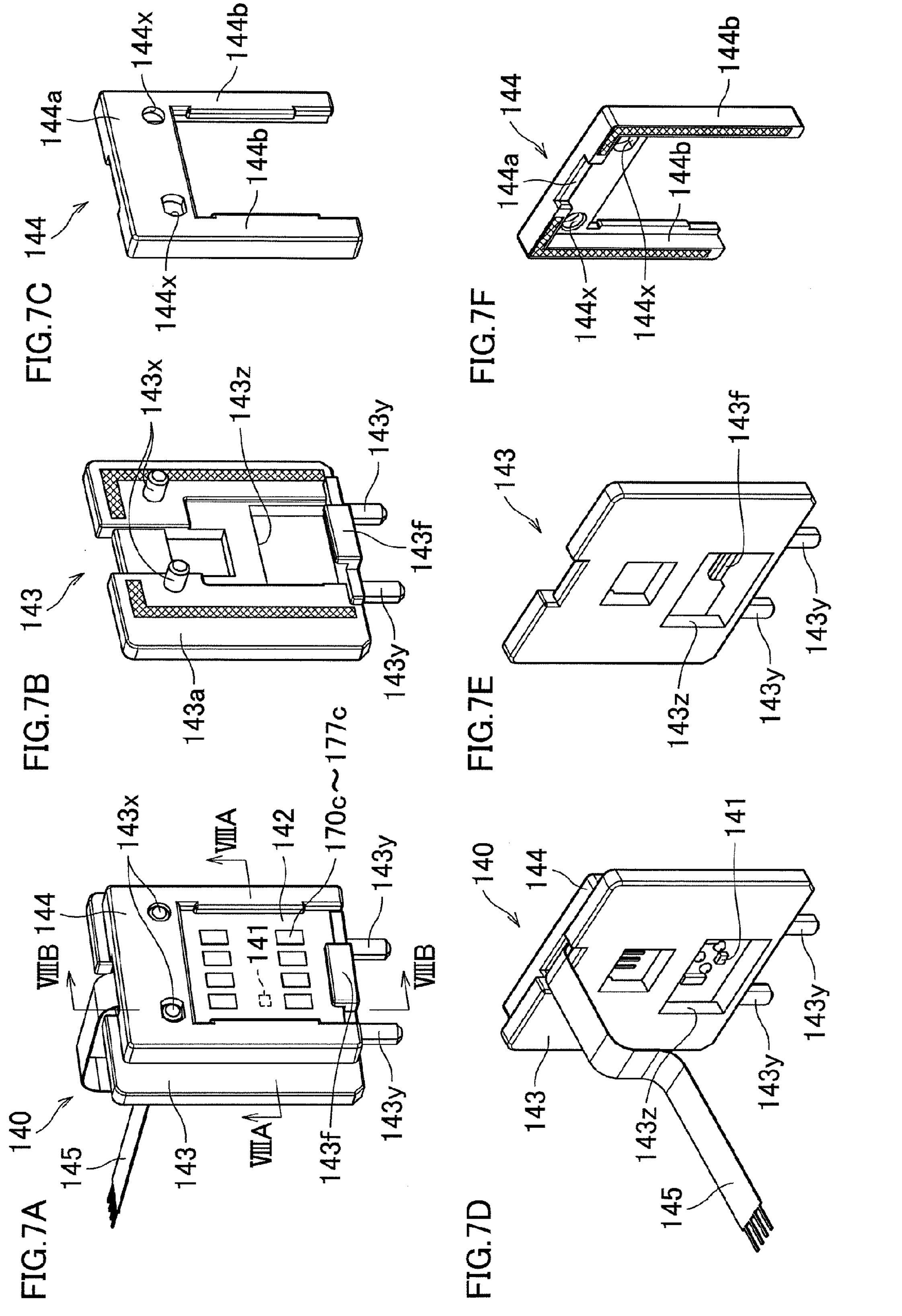
FIGS. 7A, 7B, and 7C are perspective views of the circuit board unit, a base, and a frame, respectively.
FIGS. 7D, 7E, and 7F are perspective views of the circuit board unit, the base, and the frame from opposite viewpoints from FIGS. 7A, 7B, and 7C.

In the vicinity of the end portion of the outer surface 41*c* on the upstream in the inserting direction, a concave portion 41*c*1 is formed. On the bottom surface of the concave portion 41*c*1 is provided a circuit board unit 140. The circuit board unit 140 includes, as shown in FIG. 7A and FIG. 7D, a circuit board 142, abase 143, a frame 144, and a flexible cable 145.

The circuit board 142 is a substantially rectangular plate (see FIG. 13A) and has a memory on the bottom surface and eight terminals 170*c* to 177*c* on the top surface.

The terminals 170*c* to 177*c* are exposed to the outside through the concave portion 41*c*1. The terminals 170*c* to 177*c* have the same size and. shape. and are exposed to the outer surface of the cartridge 40. Each of the terminals 170*c* to 177*c* is a rectangle formed by two short sides in parallel to the sub-scanning direction and two long sides in parallel to the vertical direction.

Figure 9A:
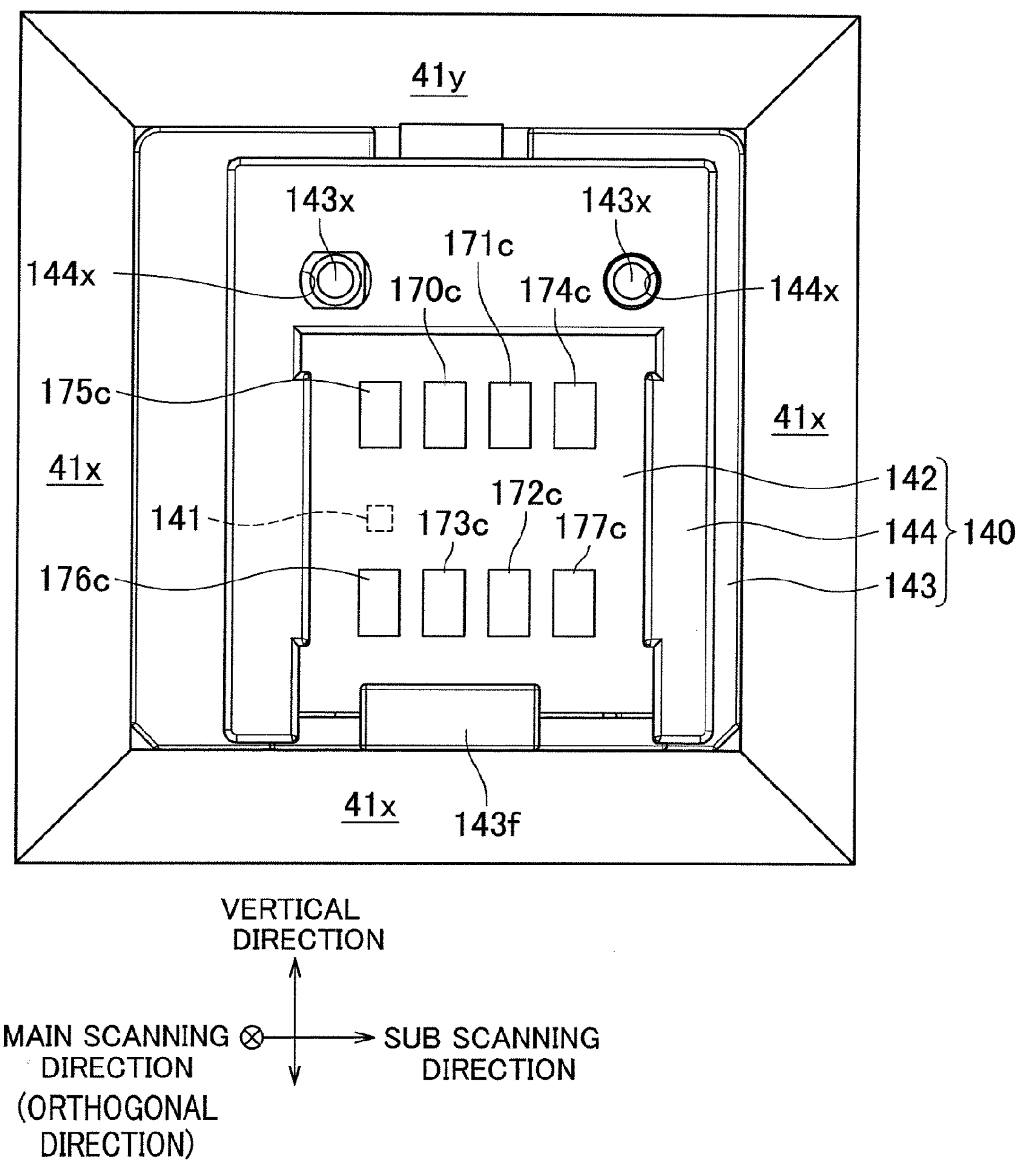
FIG. 9A shows the circuit board unit viewed in the IX direction in FIGS. 8A and 8B.

As shown in FIG. 9A, on the circuit board 142 the terminals 170*c* to 177*c* are aligned in two directions with different densities. In the present embodiment, the alignment directions are in parallel to the vertical direction (low-density alignment direction) and in parallel to the sub-scanning direction (high-density alignment direction in which the terminals are aligned with higher density than in the low-density alignment direction). respectively. Two terminals form each line in the vertical direction whereas four terminals form each line in the sub-scanning direction. In this manner, eight terminals 170*c* to 177*c* are provided.

Figure 11:
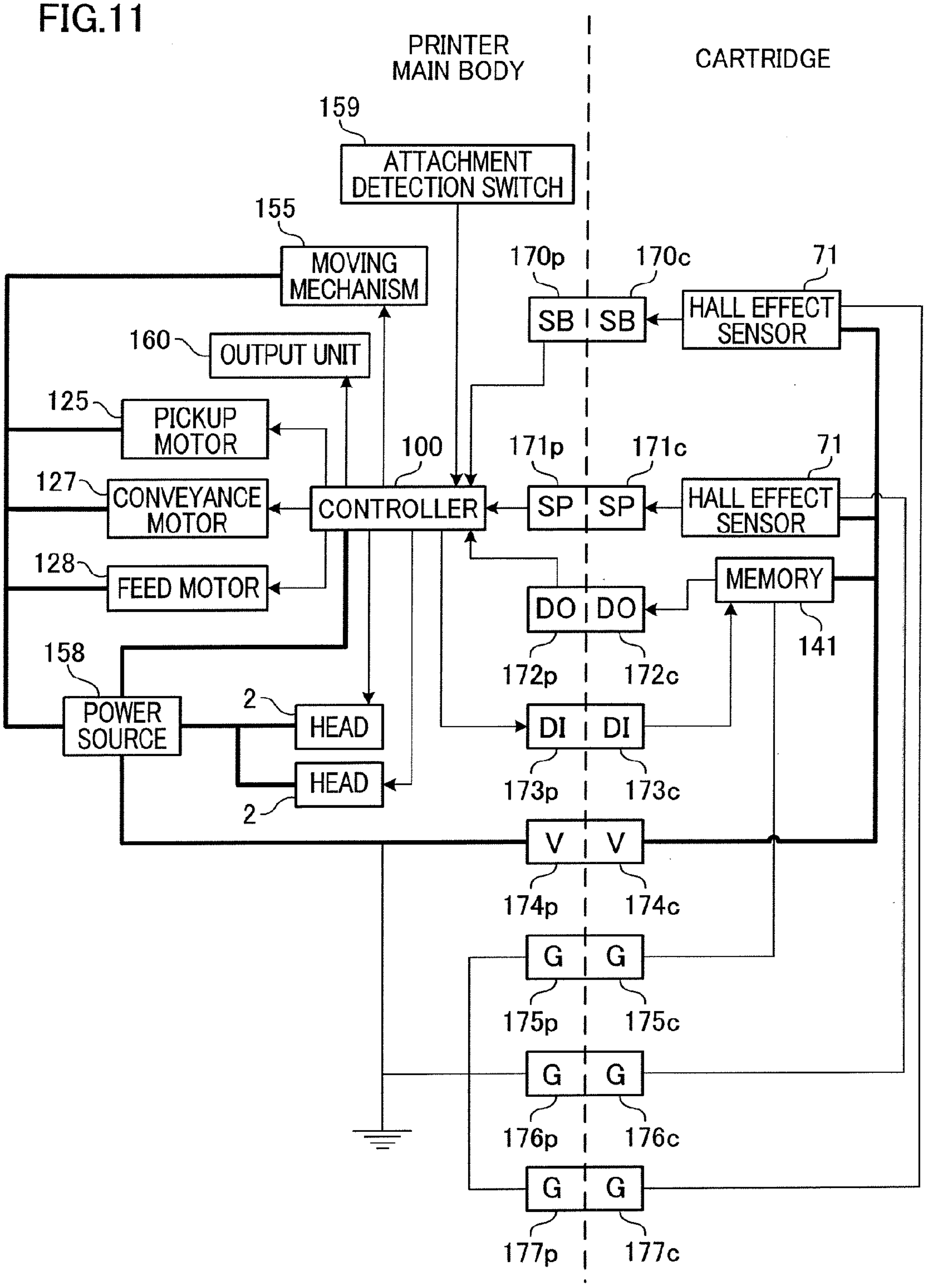
FIG. 11 is a block diagram showing the electric configuration of the cartridge and the printer main body.

As shown in FIG. 11, a sensor signal output terminal (SB) 170*c* is electrically connected to the Hall effect sensor 71 of the unit 40B, a sensor signal output terminal (SP) 171*c* is electrically connected to the Hall effect sensor 71 of the unit 40P, a data output terminal (DO) 172*c* and a data input terminal (DI) 173*c* are electrically connected to the memory 141, a power input terminal (V) 174*c* is electrically connected to the two Hall effect sensors 71 and the memory 141, and three ground terminals (G)175*c*, 176*c*, and 177*c* are electrically connected to the memory 141, the Hall effect sensor 71 of the unit 40P, and the Hall effect sensor 71 of the unit 40B, respectively. The Hall effect sensor 71 is attached to the upper wall of the outlet pipe 43. This sensor generates an electric signal by converting an electric field generated by an unillustrated magnet attached to the lower wall of the outlet pipe 43 into an electric signal. The Hall effect sensor 71 generates an electric signal having a signal intensity corresponding to the position of an unillustrated valve in the outlet pipe 43. The valve is switchable between an open position at which the internal path of the outlet pipe 43 is open and a closed position at which the internal path is closed.

Figure 6:
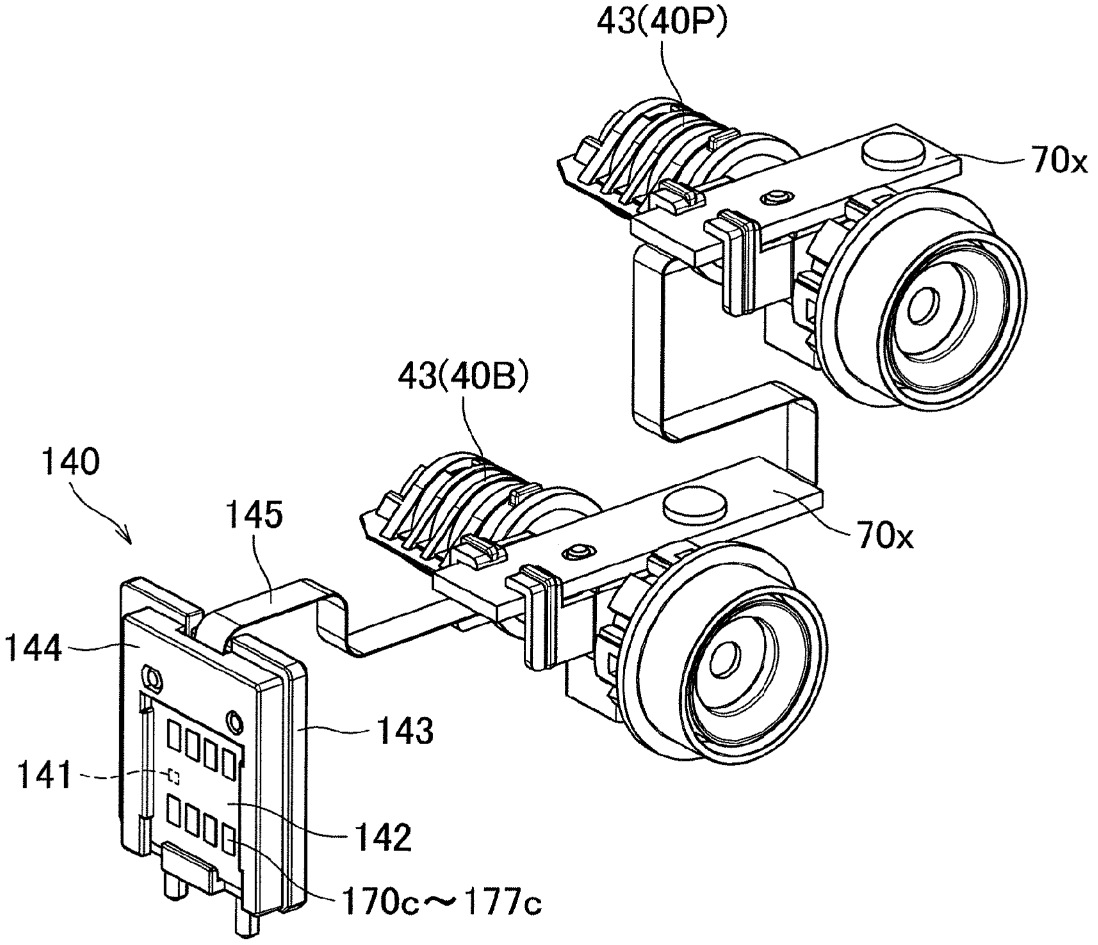
FIG. 6 is a perspective view of a circuit board unit and two outlet pipes connected thereto.

The electric connections between the terminals 170*c*, 171*c*, 174*c*, 175*c*, 176*c*, and 177*c* and the Hall effect sensors 71 are achieved by the flexible cable 145 as shown in FIG. 6. To the outlet pipe 43*s* of the units 40P and 40B, a plate 70*x* to which the flexible cable 145 is attached is fixed. The electric connections between the terminals 172*c*, 173*c*, 174*c*, 175*c*, 176*c*, and 177*c* and the memory 141 are achieved by a conductive material filling a through hole made through the circuit board 142.

The memory 141 is constituted by an EEPROM or the like, and stores data regarding an amount of remaining liquid in each reservoir 42, sensor output values (from the Hall effect sensors 71) or the like in advance. When the cartridge 40 is attached to the space C, the controller 100 is able to read data from the memory 141 and is able to rewrite data regarding the amount of remaining liquid in each reservoir 42 stored in the memory 141.

The base 143 is a substantially rectangular plate and is sufficiently larger than the circuit board 142. The base 143 includes a surface 143*a* opposing the circuit board 142, two protrusions 143*x* protruding in a direction orthogonal to the surface 143*a* (hereinafter, orthogonal direction), two protruding portions 143*y* protruding in a direction in parallel to the surface 143*a* (hereinafter, surface direction), an opening 143*z* extending in a direction orthogonal to the surface 143*a* to penetrate the surface, and a hook 143*f* provided at the center of a lower part of the surface 143*a*.

The two protrusions 143*x* are distant from each other at an upper part of the surface 143*a*. The circuit board 142 has two through holes 142*x* that are larger in size than the protrusion 143*x* when viewed in the orthogonal direction (see FIG. 13A). The through holes 142*x* have openings at the side faces of the circuit board 142. The frame 144 has two holes 144*x*. The two protrusions 143*x* penetrate the respective through holes 142*x* and are received by the holes 144*x* at their leading ends. The protrusion 143*x* and the inner circumferential surface of the corresponding through hole 142*x* are arranged to be distanced from each other for predetermined distances (e.g., 0.2 mm) in the vertical direction and the sub-scanning direction (i.e., in lengthwise and crosswise) when the protrusion 143*x* penetrates the through hole 142*x*. This allows the circuit board 142 to move for 0.2 mm in the vertical direction and in the sub-scanning direction.

Figure 12B:
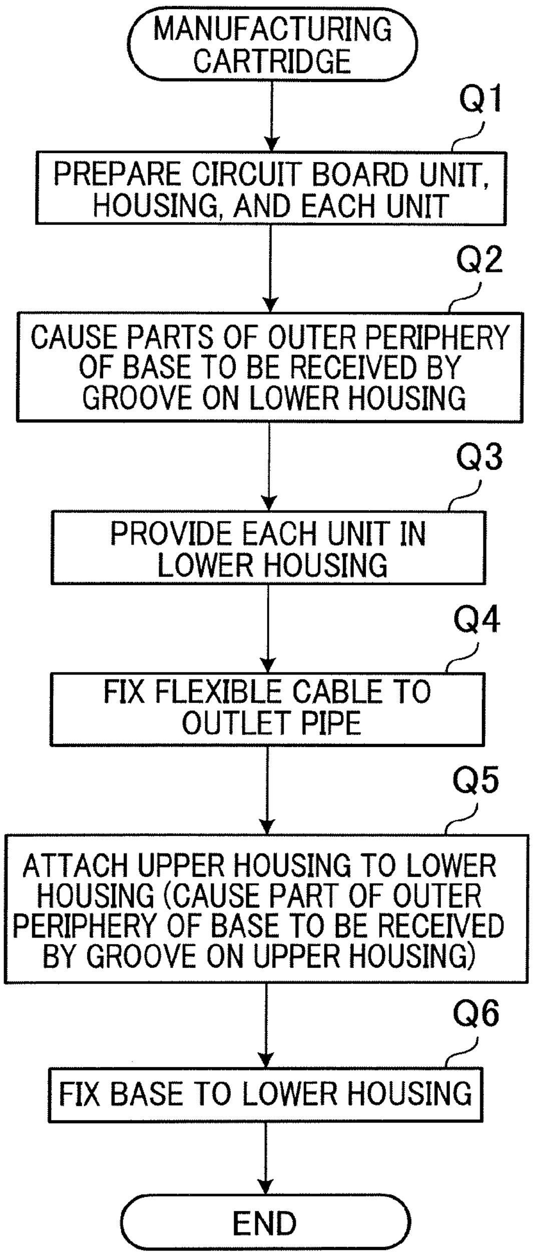
FIG. 12B is a flowchart of a method of manufacturing the cartridge.
Figure 13A:
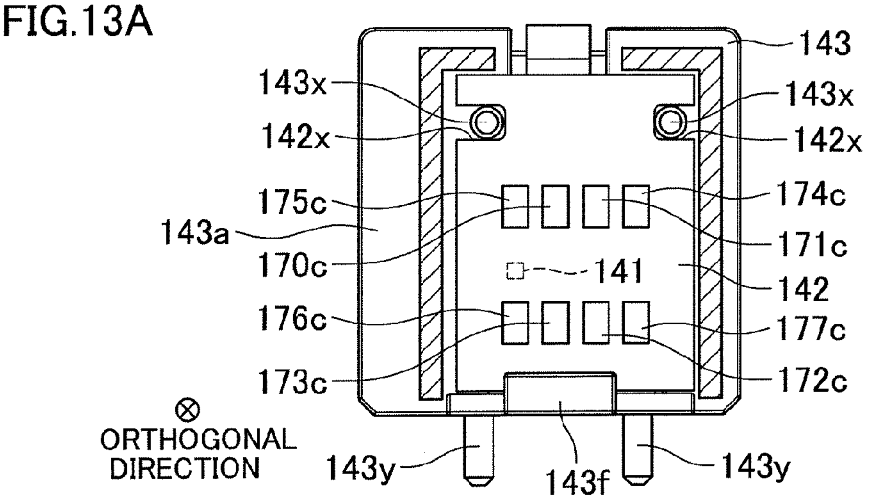
FIG. 13A is a plan view for describing a circuit board mounting step.

The two protruding portions 143*y* are provided to be distanced from each other at a lower part of the base 143. The protruding portions 143*y* are portions that are moved to penetrate the through holes 41*x*2 of the lower housing 41*x* and then fixed to the lower housing 41*x* by thermal caulking as shown in FIG. 13C, in a fixing step Q6 of the manufacturing method of the cartridge 40 (see FIG. 12B). Each protruding portion 143*y* has a linear shape before the fixing step Q6 as shown in FIG. 7B and FIG. 7E, and is deformed by thermal caulking in the fixing step Q6 (so as to be enlarged in diameter at the leading end as indicated by the dashed line in FIG. 13C).

The opening 143*z* is formed at the center of the lower part of the base 143 to oppose the memory 141 of the circuit board 142. As shown in FIG. 7D, the memory 141 is exposed to the bottom surface of the circuit board unit 140 through the opening 143*z*. The opening 143*z* is formed in such a way that, while the memory 141 is exposed through the opening 143*z*, the inner circumferential surface of the opening 143*z* and the memory 141 are distanced from each other for at least predetermined distances (which are longer than the separation distance between the corresponding protrusion 143*x* and the through hole 142*x*; 0.4 mm for example) in the vertical direction and in the sub-scanning direction (i.e., in lengthwise and crosswise). With this, even after the circuit board 142 moves in the surface direction for 0.2 mm, the memory 141 still opposes the opening 143*z*, and the memory 141 does not contact the base 143 at the time of ultrasonic welding. It is therefore possible to prevent the memory 141 from dropping off or being damaged. Furthermore, because the opening 143*z* penetrates the base 143, it is ensured that the memory 141 does not contact the base 143.

The hook 143*f* protrudes from a wall of the base 143 which defines the lower side of the opening 143*z*, in the same direction as the protrusion 143*x*. The circuit board 142 is supported by the base 143 at the protrusions 143*x* penetrating the through holes 142*x* and the hook 143*f*.

Figure 8A:
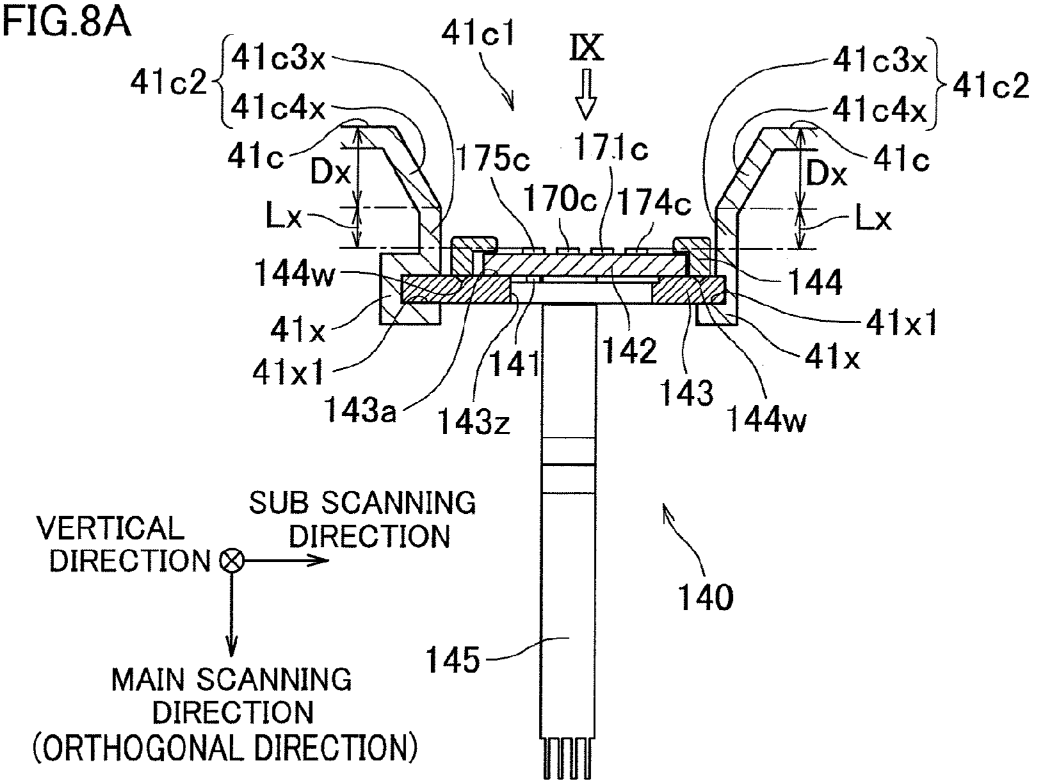
FIG. 8A is a cross section taken at the VIIIA-VIIIA line in FIG. 7A, showing the circuit board unit and the housing.
Figure 8B:
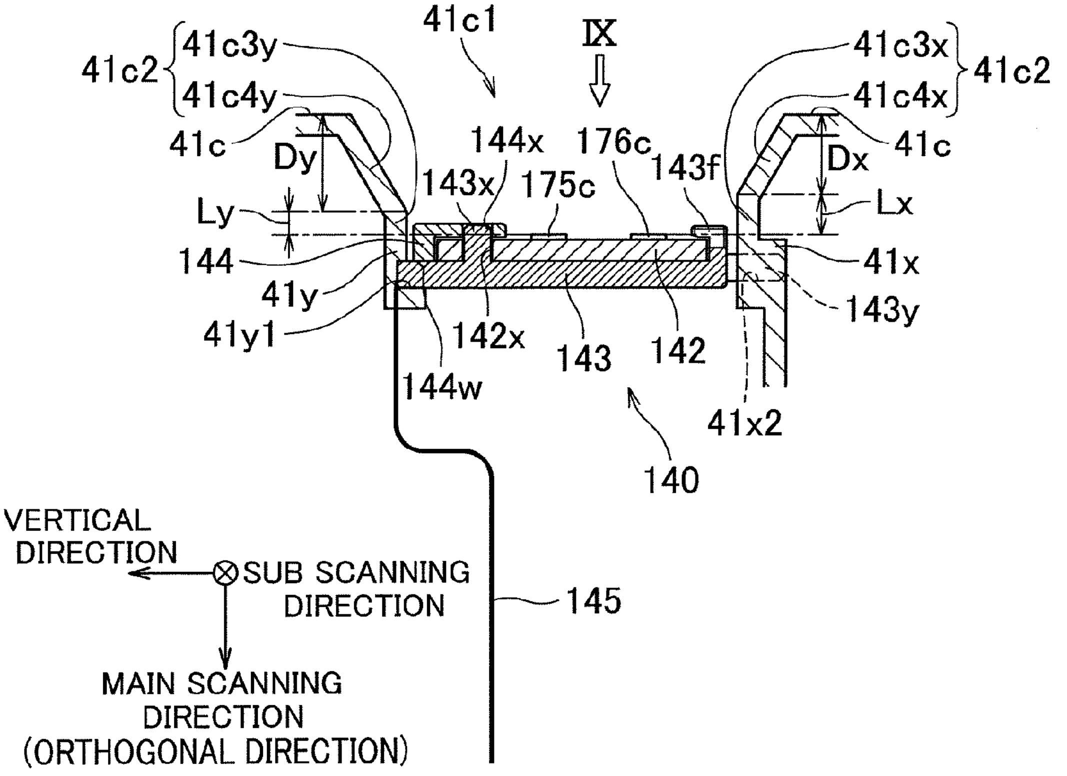
FIG. 8B is a cross section taken at the VIIIB-VIIIB line in FIG. 7A, showing the circuit board unit and the housing.

The frame 144 is a U-shaped member sufficiently larger in size than the circuit board 142, and includes a main body 144*a* having two holes 144*x* and a pair of projections 144*b* projecting from the main body 144*a*. The frame 144 is bonded, by ultrasonic welding, to a region (around the circuit board 142) of the surface 143*a* which region is not the region opposing the circuit board 142. The region of the surface 143*a* to which the frame 144 is bonded is shown hatched in FIG. 7B, and the region of the surface 143*a* to which the frame 144 is bonded is shown hatched in FIG. 7F. Furthermore, FIG. 8A and FIG. 8B show a welded part 144*w* of the frame 144. The frame 144 is fixed to the rectangular surface 143*a* along the three sides thereof except the lower side.

Figure 13B:
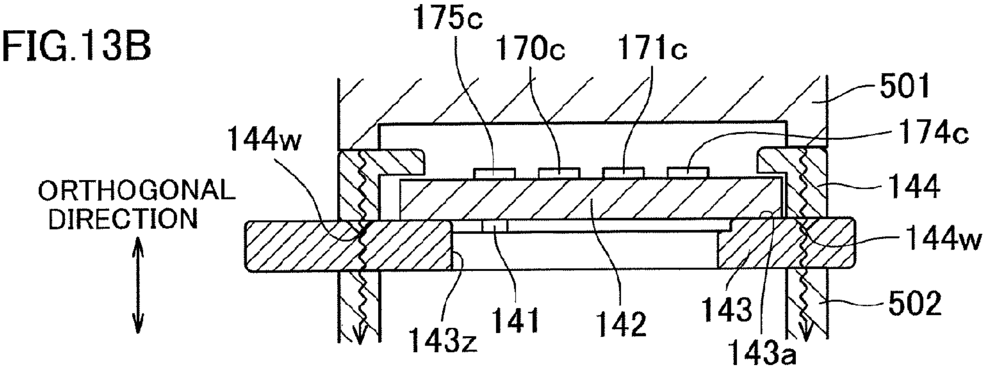
FIG. 13B is a cross section corresponding to FIG. 8A, for describing a bonding step.
Figure 13C:
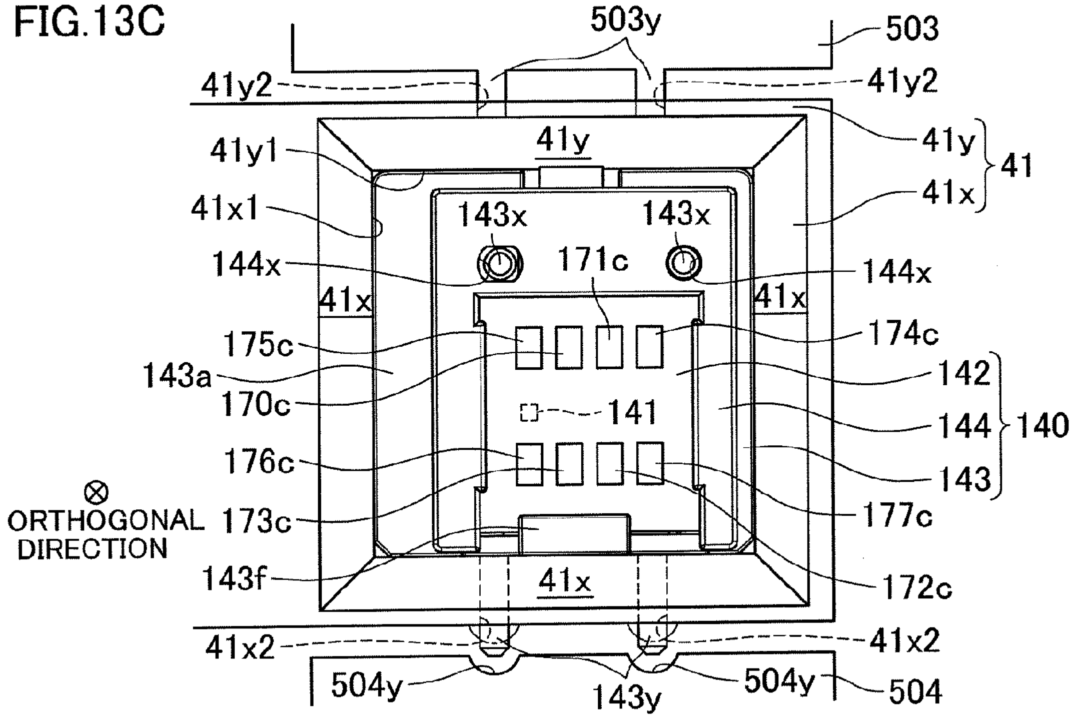
FIG. 13C corresponds to FIG. 9A and shows a fixing step in which the base is fixed to the lower housing by thermal caulking.

The circuit board 142 is not fixed to the base 143 and the frame 144, and is supported at the space between the base 143 and the frame 144 with spaces being formed in the orthogonal direction and the surface direction (see FIG. 8A, FIG. 8B. and FIG. 13B).

Figure 9B:
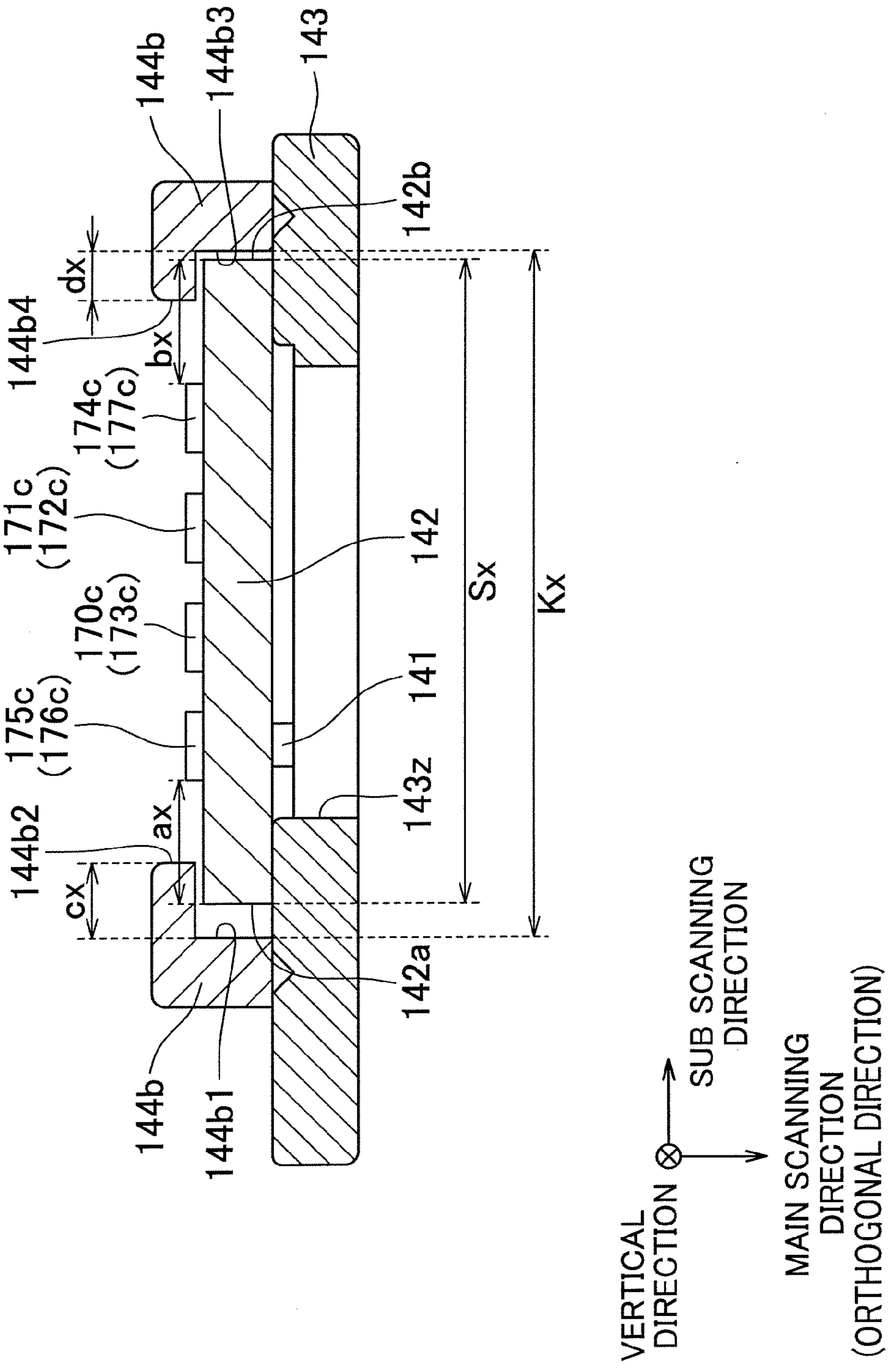
FIG. 9B is a partial enlarged view of FIG. 8A.

Now the relationships among the dimensions in the sub-scanning direction and the vertical direction will be described further with reference to FIG. 9B. As shown in FIG. 9B, the circuit board 142 provided on the base 143 has the length Sx in the sub-scanning direction. As described above, the eight terminals 170*c* to 177*c* on the upper surface of the circuit board 142 are arranged so that two terminals form each line in the vertical direction whereas four terminals form each line in the sub-scanning direction. Among the eight terminals 170*c* to 177*c*, the terminals 175*c* and 176*c* are the closest to the left edge 142*a* of the circuit board 142. Furthermore, the terminals 174*c* and 177*c* are the closest to the right edge 142*b* of the circuit board 142 among the eight terminals 170*c* to 177*c*. The distance between the left edges of the terminals 175*c* and 176*c* and the left edge 142*a* of the circuit board 142 is ax, whereas the distance between the right edges of the terminals 174*c* and 177*c* and the right edge 142*b* of the circuit board 142 is bx.

The paired projections 144*b* of the frame 144 are provided on the respective sides of the circuit board 142 in the sub-scanning direction. The distance in the sub-scanning direction between an inner surface 144*b*1 of a part of the projection 144*b* depicted in the left side of FIG. 9B which part extends in the orthogonal direction and an inner surface 144*b*3 of a part of the projection 144*b* depicted in the right side of FIG. 9B which part extends in the orthogonal direction is Kx. That is to say, the paired projections 144*b* function as walls (regulating walls) for regulating the movement of the circuit board 142 in the sub-scanning direction, and the distance Kx indicates the movable range of the circuit board 142 in the sub-scanning direction, which is defined by the pair of projections 144*b*. As described above, the movement of the circuit board 142 in the sub-scanning direction is restricted to 0.2 mm by the engagement of the protrusions 143*x* with the through holes 142*x*. In the present embodiment, the distance Kx—the distance Sx=0.2 mm. For this reason, there is a possibility that the left edge 142*a* of the circuit board 142 contacts the inner surface 144*b*1 and the right edge 142*b* of the circuit board 142 contacts the inner surface 144*b*3.

The paired projections 144*b* of the frame 144 are bended at right angles at the leading ends of the orthogonally-extending parts toward each other, and hence each projection 144*b* has a part extending in the sub-scanning direction. The leading end 144*b*2 of the part of the projection 144*b* depicted in the left side in FIG. 9B which part extends in the sub-scanning direction is away from the inner surface 144*b*1 by the distance cx. The lower surface of the part extending in the sub-scanning direction (i.e., a first region of the opposing surface) opposes a part of the upper surface (terminal surface) of the circuit board 142, which surface is continuous from the left edge 142*a* of the circuit board 142.

Furthermore, the leading end 144*b*4 of the part of the projection 144*b* depicted in the right side which part extends in the sub-scanning direction is away from the inner surface 144*b*3 by the distance dx. The lower surface of the part extending in the sub-scanning direction (i.e., a second region of the opposing surface) opposes a part of the upper surface (terminal surface) of the circuit board 142 which surface is continuous from the right edge 142*b* of the circuit hoard 142.

In the present embodiment, the six distances Kx, Sx, ax, bx, cx, and dx have a relationship represented by the following two inequalities.

$$Kx-Sx<cx<ax \quad (1)$$

$$Kx-Sx<dx<bx \quad (2)$$

The first part of the inequality (1) (Kx−Sx<cx) indicates that, even if the right edge 142*b* of the circuit board 142 contacts the inner surface 144$b$3, the first region of the opposing surface opposes the terminal surface of the circuit board 142. The second part of the inequality (1) (cx<ax) indicates that, even if the left edge of the circuit board 142 contacts the inner surface 144$b$1, the terminals 175$c$ and 176$c$ closest to the left edge 142$a$ of the circuit board 142 are exposed without opposing the first region of the opposing surface.

The first part of the inequality (2) (Kx−Sx<dx) indicates that, even if the left edge 142$a$ of the circuit board 142 contacts the inner surface 144$b$1, the second region of the opposing surface opposes the terminal surface of the circuit board 142. The second part of the inequality (2) (dx<bx) indicates that, even if the right edge 142$b$ of the circuit board 142 contacts the inner surface 144$b$3, the terminals 174$c$ and 177$c$ closest to the right edge 142$a$ of the circuit board 142 are exposed without opposing the second region of the opposing surface.

While the relationship among the dimensions in the sub-scanning direction has been described, a similar relationship exists among the dimensions in the vertical direction. In this regard, the length of the circuit board 142 in the vertical direction is Sy. The distance between the inner surface of a part of the main body 144$a$ of the frame 144 which part extends in the orthogonal direction and the inner surface of a part of the hook 143$f$ which part extends in the orthogonal direction is Ky. That is to say, the main body 144$a$ and the hook 143$f$ function as walls (regulating walls) for regulating the movement of the circuit board 142 in the vertical direction. As described above, the movement of the circuit board 142 in the vertical direction is restricted to 0.2 mm by the engagement of the protrusions 143$x$ with the through holes 142$x$. However, because in the present embodiment the distance Ky−the distance Sy=0.2 mm, there is a possibility that the upper edge of the circuit board 142 contacts the inner surface of the orthogonally extending part of the main body 144$a$ of the frame 144 and the lower edge of the circuit board 142 contacts the orthogonally extending part of the hook 143$f$.

The four terminals 175$c$, 170$c$, 171$c$, and 174$c$ are the closest to one edge portion (upper edge in FIG. 9A) of the circuit board 142 in the vertical direction, among the eight terminals 170$c$ to 177$c$. On the other hand, the four terminals 176$c$, 173$c$, 172$c$, and 177$c$ are the closest to the other edge portion (lower edge in FIG. 9A) of the circuit board 142 in the vertical direction, among the eight terminals 170$c$ to 177$c$. The distance between the upper edges of the four terminals 175$c$, 170$c$, 171$c$, and 174$c$ and the upper edge of the circuit board 142 is represented as ay, whereas the distance between the lower edges of the four terminals 176$c$, 173$c$, 172$c$, and 177$c$ and the lower edge of the circuit board 142 is represented as by.

The main body 144$a$ of the frame 144 and the hook 143$f$ are bended at right angles at the leading ends of the orthogonally extending parts toward each other, and hence the main body 144$a$ and the hook 143$f$ have the parts extending in the vertical direction. The leading end of the vertically extending part of the main body 144$a$ is away from the inner surface of the orthogonally extending part thereof by the distance cy in the vertical direction. The lower surface of the vertically extending part (i.e., a third region of the opposing surface) opposes a part of the upper surface (terminal surface) of the circuit board 142 which surface is continuous from the upper edge of the circuit board 142.

Furthermore, the leading end of the vertically extending part of the hook 143$f$ is away from the inner surface of the orthogonally extending part thereof by the distance dy in the vertical direction. The lower surface of the vertically extending part (i.e., a fourth region of the opposing surface) opposes a part of the upper surface (terminal surface) of the circuit board 142 which surface is continuous from the lower edge of the circuit board 142.

In the present embodiment, the relationship among the six distances Ky, Sy, ay, by, cy, and dy is represented by the following two inequalities. As the relationship represented by them holds, it is possible to ensure that the circuit board 142 opposes the opposing surface and the eight terminals 170$c$ to 177$c$ are exposed without opposing the opposing surface, even if the circuit board 142 moves within the allowable range in the vertical direction, in a similar manner as in the case of the sub-scanning direction.

$$Ky-Sy<cy<ay \tag{3}$$

$$Ky-Sy<dy<by \tag{4}$$

Now how the circuit board unit 140 is attached to the housing 41 and how a part of the housing 41 to which part the circuit board unit 140 is attached is structured will be described.

Figure 5A:
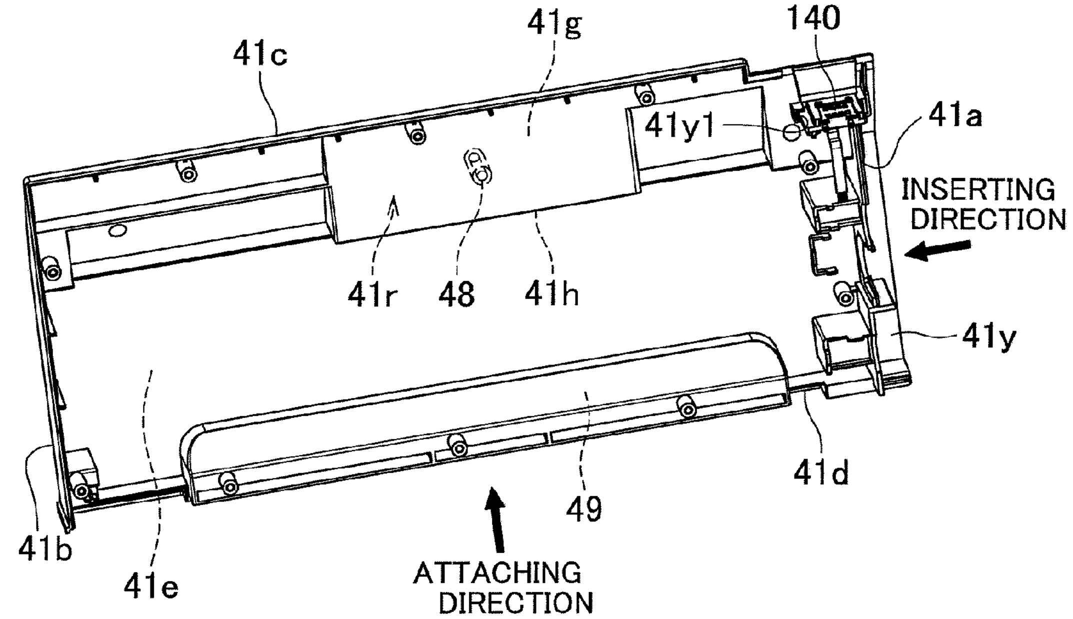
FIG. 5A and FIG. 5B are perspective views of an upper housing and a lower housing of the cartridge, respectively.
Figure 5B:
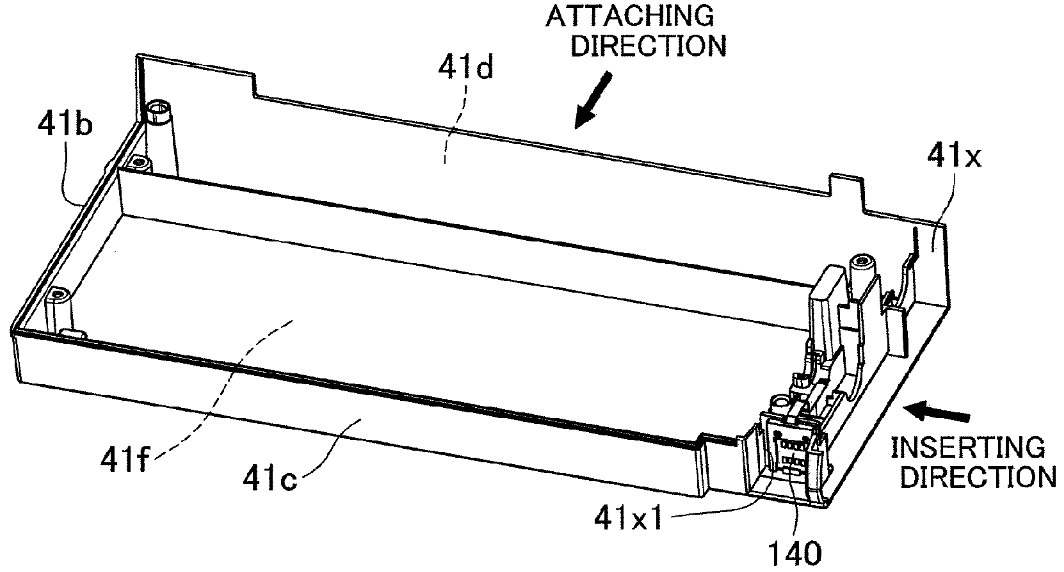

The housing 41 includes an upper housing 41$y$ and a lower housing 41$x$ as shown in FIG. 5A and FIG. 5B, and a space for housing the reservoirs 42 is defined as the housing 41$x$ and 41$y$ are attached to each other. A groove 41$y$1 formed on the upper housing 41$y$ and a groove 41$x$1 formed on the lower housing 41$x$ receive the outer periphery of the base 143 (i.e., a part of the base 143 which part is on the outer side of the part to which the frame 144 is bonded). The upper side of the outer periphery of the base 143 is received by the groove 41$y$1 whereas the other three sides of the outer periphery of the base 143 are received by the groove 41$x$1. In other words, as shown in FIG. 9A, the upper side of the base 143 is supported by the upper housing 41$y$ and the lower side and the lateral sides of the base 143 are supported by the lower housing 41$x$.

The housing 41 has, as shown in FIG. 8A and FIG. 8B, a peripheral wall 41$c$2 defining a concave portion 41$c$1. The peripheral wall 41$c$2 includes a square-cylindrical orthogonal part made up of three partial orthogonal parts 41$c$3$x$ and a single partial orthogonal part 41$c$3$y$ extending in an orthogonal direction (which is in parallel to the main scanning direction), and a square frustum inclined part made up of three partial inclined parts 41$c$4$x$ and a single partial inclined part 41$c$4$y$ inclined with respect to the orthogonal direction. The three partial orthogonal parts 41$c$3$x$ and the three partial inclined parts 41$c$4$x$ are formed. on the lower housing 41$x$, whereas the partial orthogonal part 41$c$3$y$ and the partial inclined part 41$c$4$y$ are formed on the upper housing 41$y$. The partial inclined parts 41$c$4$x$ and 41$c$4$y$ are inclined to be away from the circuit board 142 with respect to the orthogonal direction as compared to the partial orthogonal parts 41$c$3$x$ and 41$c$3$y$ such that the concave portion 41$c$1 increases in size when viewed in the orthogonal direction.

The length Lx of the three partial orthogonal parts 41$c$3$x$ is longer than the length Ly of the partial orthogonal part 41$c$3$y$ in the orthogonal direction. Furthermore, the total sum of the length Lx of the three partial orthogonal parts 41$c$3$x$ in the orthogonal direction and the length Dx of the partial inclined parts 41$c$4$x$ in the orthogonal direction is identical with the total sum of the length Ly of the partial orthogonal part 41$c$3$y$ in the orthogonal direction and the length Dy of the partial inclined part 41$c$4$y$ in the orthogonal direction. (In short, (Lx+Dx)=(Ly+Dy).)

Now, referring to FIG. 2 and FIGS. 10A, 10B, and 10C, the attaching chamber (space C) of the printer main body, to which the cartridge 40 is attached, will be described.

The space C is defined by the walls of the housing 1*a*. The walls include walls 1*aa*, 1*ab*, 1*ac*, 1*af*, or the like.

The walls 1*aa* and 1*ab* are both substantially in parallel to the attaching direction and oppose each other over a space in the inserting direction. The wall 1*ac* is provided with two hollow needles 153 corresponding to the units 40B and 40P, respectively, and a supporter 154 that supports the hollow needles 153. The supporter 154 is arranged to be movable in the inserting direction and in the direction opposite to the inserting direction with respect to the housing 1*a*, as the moving mechanism 155 (see FIG. 11) is driven. Each hollow needle 153 is able to selectively take a non-inserted position at which the needle is not inserted into the outlet pipe 43 and an inserted position at which the needle is inserted into the outlet pipe 43, as the supporter 154 moves. The two hollow needles 153 are communicated, via tubes and joints, with the head 2 ejecting the black ink and the head 2 ejecting the preprocessing liquid, respectively. The wall 1*ac* is substantially orthogonal to the attaching direction and is provided at the downstream end of the attaching chamber in the attaching direction. This wall 1*ac* is provided between the walls 1*aa* and 1*ab* in the inserting direction. The wall 1*af* is substantially orthogonal to the walls 1*aa*, 1*ab*, and 1*ac* and constitutes the bottom surface of the space C. At around the upstream end of the wall 1*af* in the attaching direction, a concave portion 1*afx* through which a user is able to insert his/her fingers to grip the grip 49 is formed (see FIG. 2).

The circuit board 182 is substantially identical in size with the circuit board 142 and is provided at a position opposing the circuit board 142 when the cartridge 40 is attached to the space C. On the surface of the circuit board 182 are provided eight terminals 170*p* to 177*p* (see FIG. 11) corresponding to the eight terminals 170*c* to 177*c*, respectively. As shown in FIG. 11., a sensor signal receiving terminal (SB) 170*p*, a sensor signal receiving terminal (SP)171*p*, a data receiving terminal (DO)172*p*, and a data transmission terminal (DI) 173*p* are electrically connected to the controller 100, a power output terminal (V)174*p* is electrically connected to the power source 158, and three ground terminals (G)175*p*, 176*p*, and 177*p* are grounded. The power source 158 is provided inside the housing 1*a*.

Now, referring to figures such as FIG. 11, a process from the step of attaching the cartridge 40 to the space C to the establishment of the communication between the cartridge 40 and the head 2 will be described. In FIG. 11, power supply lines are depicted by thick lines whereas signal lines are depicted by thin lines.

To attach the cartridge 40 to the space C, a user of the printer 1 opens the cover 1*c* in the first place (see FIG. 1). Thereafter, the user holds the grip 49 by, for example, one hand (see FIG. 3), and inserts four fingers except the thumb of the one hand into the concave portion 1*afx* (see FIG. 2). In this state, the cartridge 40 is moved in the attaching direction to be inserted into the space C (see FIG. 10A). In this regard, the cartridge 40 is inserted to reach the position shown in FIG. 10B.

Figure 10B:
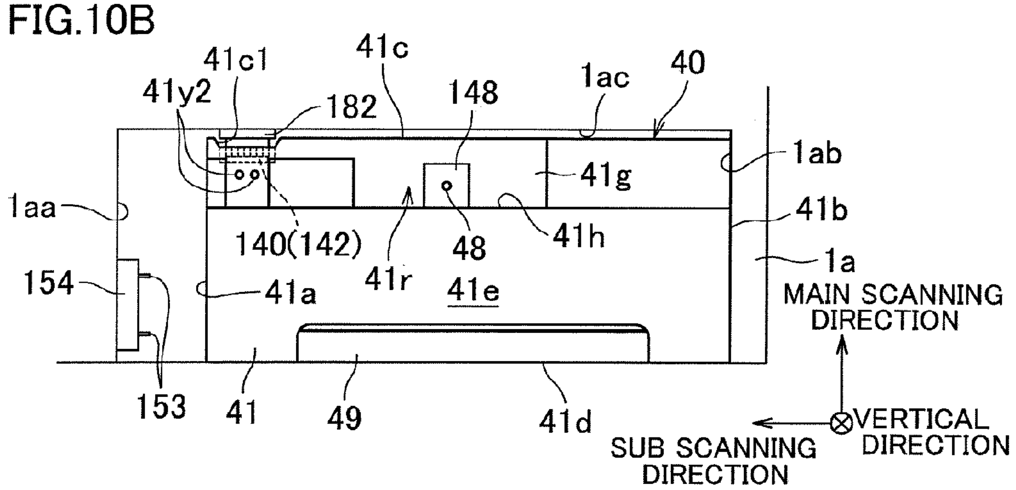

Before the cartridge 40 reaches the position shown in FIG. 10B, the circuit board 182 is inserted into the concave portion 41*c*1 to contact the circuit board 142 and the terminals 170*c* to 177*c* contact the terminals 170*p* to 177*p*, respectively. In so doing, first of all, the partial inclined parts 41*c*4*x* and 41*c*4*y* shown in FIG. 8A and FIG. 8B guide the circuit board 182 into the concave portion 41*c*1, and then the circuit board 182 is aligned with the circuit board 142 by the three partial orthogonal parts 41*c*3*x* and the one partial orthogonal part 41*c*3*y*. In this regard, because the two partial orthogonal parts 41*c*3*x* sandwiching the terminals 170*c* to 177*c* in the sub-scanning direction (later-described high-density alignment direction) are longer than the partial orthogonal part 41*c*3*y* in the orthogonal direction (Lx>Ly), the partial orthogonal parts 41*c*3*x* sandwiching the terminals 170*c* to 177*c* in the sub-scanning direction contact the circuit board 182 before both of the partial orthogonal part 41*c*3*x* and the partial orthogonal part 41*c*3,7 sandwiching the terminals 170*c* to 177*c* in the vertical direction (later-described low-density alignment direction) contact the circuit board 182. As such, among the alignment in the vertical direction and the alignment in the sub-scanning direction, the alignment in the sub-scanning direction (high-density alignment direction) is carried out first.

As such, the terminals 170*c* to 177*c* contact the respective terminals 170*p* to 177*p*, with the result that electric connections between the terminals 170*c* to 177*c* and the terminals 170*p* to 177*p* are achieved. With this, the electric power is supplied from the power source 158 to the Hall effect sensors 71 and the memory 141 via the terminals 174*p* and 174*c*. Furthermore, the controller 100 becomes able to receive a signal from the Hall effect sensor 71 of the unit 40B via the terminals 170*c* and 170*p*, receive a signal from the Hall effect sensor 71 of the unit 40P via the terminals 171*c* and 171*p*, read data from the memory 141 via the terminals 172*c* and 172*p*, and write and. rewrite data to/in the memory 141 via the terminals 173*c* and 173*p*.

At the same time the cartridge 40 reaches the position shown in FIG. 10B, the unillustrated protrusion of the fitting member 148 of the housing 1*a* is fitted to the hole 48, with the result that the housing 41 is locked and becomes immovable. After the cartridge 40 reaches the position shown in FIG. 10B, an attachment detection switch 159 (see FIG. 11) outputs an ON signal when the user closes the cover 1*c* (see FIG. 1). Upon receiving the ON signal, the controller 100 determines that the attachment of the cartridge 40 has been completed.

The attachment detection switch 159 has a protrusion formed at the wall of the housing 1*a* which wall defines the opening 10*c* (see FIG. 1). The protrusion protrudes when the cover 1*c* is open, and is retracted into the wall when the cover 1*c* is closed as the protrusion is pushed by the cover 1*c*. The attachment detection switch 159*e* outputs an OFF signal when the protrusion protrudes, and outputs the ON signal when the protrusion is retracted into the wall.

Figure 10C:
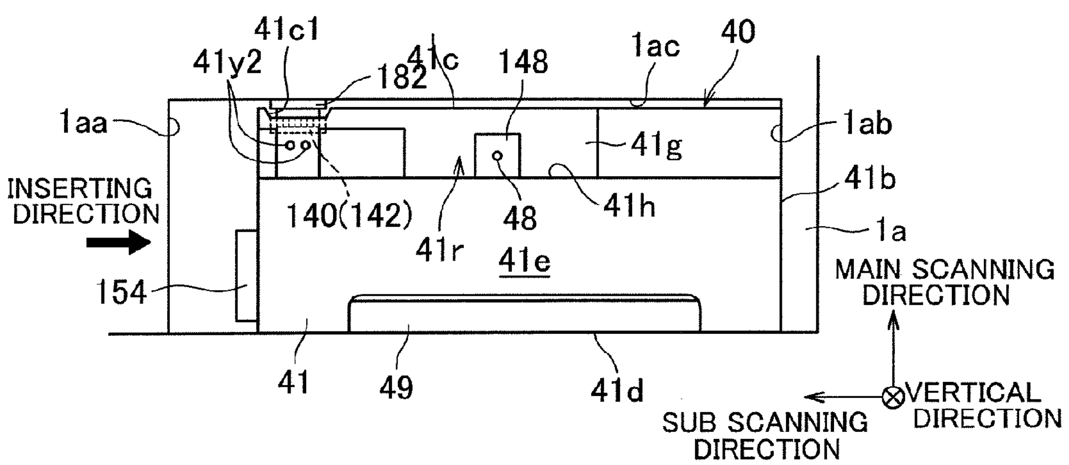

When determining that the attachment of the cartridge 40 has been completed, the controller 100 reads out data (regarding an amount of liquid remaining in each reservoir 42, a sensor output value, or the like) from the memory 141, and controls the moving mechanism 155 (see FIG. 11) to move the supporter 154 in the inserting direction together with the two hollow needles 153 supported by the supporter 154, as shown in FIG. 10C, When the movement of the hollow needles 153 starts, in each of the units 40B and 40P, the hollow needle 153 penetrates the stopper at the leading end of the outlet pipe 43 in the main scanning direction, and then the hollow needle 153 moves while pushing the valve body of a valve provided inside the outlet pipe 43, with the result that the valve moves from the closed position to the open position and the reservoir 42 is made to the head 2 via the outlet pipe 43.

Based on the output value read out from the memory 141 and the signals received from the Hall effect sensors 71 of the units 40B and 40P, the controller 100 determines whether the valve in the outlet pipe 43 has been moved to the open position in each of the units 40B and 40P.

When determined that the valve is at the open position in each of the units 40B and 40P, the controller 100 determines whether a recording command has been input from an external apparatus. When the recording command has been input, the controller 100 determines whether a required amount of liquid, is smaller than the remaining amount. This determination is made as to both the black ink and the preprocessing liquid. The required amount of liquid indicates an amount of liquid necessary to be ejected for the recording instructed by the recording command. This required amount is calculated based on the image data in the recording command. The remaining amount of liquid is read out from the memory 141. When the required amount is not smaller than the remaining amount, the controller 100 delivers error notification by using an output unit 160 (see FIG. 11) such as a display and a speaker of the printer 1, and stops the operations of the components of the printer 1. When the required amount is smaller than the remaining amount, the controller 100 controls the operations of the pickup motor 125, the conveyance motor 127, the feed motor 128, the head 2, or the like to record an image on the sheet P based on the image data.

Figure 12A:
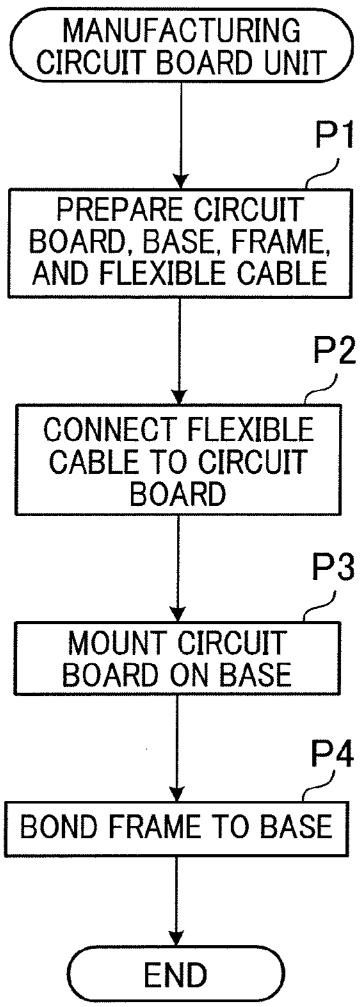
FIG. 12A is a flowchart of a method of manufacturing the circuit board unit.

Now, referring to FIG. 12A, FIG. 13A, and FIG. 13B, a manufacturing method of the circuit board unit 140 will be described.

To begin with the circuit board 142, the base 143, the frame 144, and the flexible cable 145 are prepared (P1). After P1, the flexible cable 145 is connected to the circuit board 142 (P2). In so doing, the wires of the flexible cable 145 are electrically connected to the terminals 170*c*, 171*c*, 174*c*, 175*c*, 176*c*, and 177*c* of the circuit board 142.

After P2, the circuit board 142 is moved to oppose the surface 143*a* of the base 143 and is mounted on the surface 143*a* (P3: circuit board mounting step). In so doing, as shown in FIG. 13A, the protrusion 143*x* is moved to penetrate the through hole 112*x*. After P3, while the protrusion 143*x* is received by the hole 144*x*, the frame 144 is mounted on the base 143, no that the frame 144 is bonded to the region of the surface 143*a* of the base 143, which region is shown hatched in FIG. 13A (P4: bonding step).

In P4, gaps are formed between the base 143 and the frame 144 in the orthogonal direction and in the surface direction, and the circuit board 142 is supported with the gaps (see FIG. 13B). In the present embodiment, the gaps are formed around the entire outer periphery of the circuit board 112 in the surface direction.

In P4, as shown in FIG. 13B, a generator 501 is provided on the top surface of the frame 144 (i.e., the surface opposite to the bottom surface bonded to the base 143) in advance, and a receiver 502 is provided at a part, which opposes the bonding region (shown hatched in FIG. 13A), of the bottom surface (opposite to the surface 143*a*) of the base 143. When the generator 501 generates ultrasonic waves in this state, the ultrasonic waves pass through the frame 144 and the base 143 and are eventually received by the receiver 502. The ultrasonic waves reach the bonding region at which the frame 144 contacts the base 143, with the result that the part of the frame 144 that contacts the base 143 is molten. With this, the frame 144 is bonded to the base 143 and the welded part 144*w* is formed on the frame 144. As such, in the present embodiment the frame 144 is bonded by ultrasonic welding.

Through the steps above, the manufacture of the circuit board unit 140 is completed.

Now, a manufacturing method of the cartridge 40 will be described with reference to FIG. 12B and FIG. 13C.

To begin with, the circuit board unit 140, the housing 41, and the unit 40B and 40P manufactured as described above are prepared (Q1). After Q1, as shown in FIG. 5B, parts of the outer periphery of the base 143 (i.e., the lower side and the lateral sides) are received by the groove 41*x*1 of the lower housing 41*x* (Q2: first receiving step). As such, the circuit board unit 140 is attached to the lower housing 41*x*. In Q2, as shown in FIG. 13C, the protruding portions 143*y* of the base 143 are moved so as to penetrate the through holes 41*x*2 of the lower housing 41*x*.

After Q2, the units 40B and 40P are provided in the lower housing 41*x* (Q3). After Q3, as shown in FIG. 6, the flexible cable 145 is fixed to the plate 70*x* of each outlet pipe 43 (Q4). At the same time, the wires of the flexible cable 145 are electrically connected to the respective Hall effect sensors 71.

After Q4, the upper housing 41*y* is attached to the lower housing 41*x*, and, as shown in FIG. 5A, parts of the base 143 other than the above-described parts (i.e, the upper side) are received by the groove 41*y*1 of the upper housing 41*y* (Q5: second receiving step). After Q5, the protruding portions 143*y* having been inserted into the through holes 41*x*2 are thermally caulked, with the result that the base 143 is fixed to the lower housing 41 (Q6).

In Q6, as shown in FIG. 13C, the supporting member 503 is provided in advance above the upper housing 41*y* to oppose the circuit board unit 140. and a heating pressuring member 504 is provided in advance below the lower housing 41*x* to oppose the circuit board unit 140. In so doing, the two protrusions 503*y* of the supporting member 503 are inserted into the two holes 41*y*2 (see FIGS. 3A and 3C) of the upper housing 41*y* to contact the upper wall of the base 143. Furthermore, the two concave portions 504*y* of the heating pressuring member 504 are positioned to oppose the leading ends of the two protruding portions 143*y*. As the base 143 in this state is heated and pressurized by using the heating pressuring member 504, the leading ends of the protruding portions 143*y* are plastically deformed to conform in shape to the concave portions 504*y* as indicated by the dashed lines in FIG. 13C. As a result, the enlarged parts of the leading ends of the protruding portions 143*y* are engaged with the lower surface of the lower housing 41*x*, and the base 143 is fixed to the lower housing 41*x* while the protruding portions 143*y* penetrate the through holes 41*x*2.

Through the steps above, the manufacture of the cartridge 40 is completed.

As described above, in the circuit board unit 140 of the present embodiment, the circuit board 142 is fixed to none of the base 143 and the flame 144, and is supported at the space between the base 143 and the frame 144 with gaps (margins) (see FIG. 8A, FIG. 8B and FIG. 13B). Therefore the circuit board 142 is less likely to receive stress and hence the degradation of the circuit board 142 and the electronic component (such as the memory 141, the terminals 170*c* to 177*c*) mounted on the circuit board 142 is restrained.

In the circuit board unit 140 of the present embodiment, stress on the circuit board 142 is less likely to be generated not only when the circuit board unit 140 is manufactured but also when the circuit board unit 140 is transported and when the circuit board unit 140 is attached to the cartridge 40. For example, even if an external force is exerted to the circuit board unit 140 at the time of transporting the circuit board unit 140 or attaching the circuit board unit 140 to the cartridge 40, the external force is unlikely to influence on the circuit board 142 thanks to the gaps described above, unless, for example, the circuit board 142 is directly touched by a hand.

Furthermore, in the circuit board unit 140 of the present embodiment, the effect of cooling the electronic component by the air in the gaps is attained.

In the circuit board unit 140 of the present embodiment, the frame 144 is bonded to the base 143 by ultrasonic welding. Furthermore, according to the manufacturing method of the circuit board unit 140 of the present embodiment, the frame 144 is bonded to the base 143 by ultrasonic welding in the bonding step P4. In this case, the circuit board unit 140 is wholly downsized as compared to the cases where the frame 144 is bonded to the base 143 by thermal welding or thermal caulking. More specifically, when the frame 144 is bonded to the base 143 by thermal welding or thermal caulking, it may be necessary to arrange the outer circumferential region of the circuit board 142 (i.e., the region outside the region of the circuit board 142 where the electronic component (such as the memory 141 and the terminals 170*c* to 177*c*) is mounted) to be large in size in order to restrain heat from being transferred to the electronic component at the time of the bonding. Furthermore, it is necessary in thermal welding or thermal caulking to secure regions for the enlargement of the leading ends of the protrusions. In the case of screwing, it is also necessary to secure regions for the screw heads and to enlarge the outer circumferential region of the circuit board 142 in consideration of the transfer of the stress at the time of screwing. On the other hand, it is unnecessary in ultrasonic welding to enlarge the size of the outer circumferential region of the circuit board 142 to restrain the heat transfer to the electronic component and to secure regions for the enlargement of the protrusion leading ends or for the screw heads. The size of the circuit board unit 140 is therefore wholly downsized.

In the circuit board unit 140 of the present embodiment, the protrusion 143*x* of the base 143 penetrates the through hole 142*x* of the circuit board 142 and is received by the hole 144*x* of the frame 144 at the leading end. Furthermore, according to the manufacturing method of the circuit board unit 140 of the present embodiment, in the circuit board mounting step P3, the protrusions 143*x* of the base 143 are moved to penetrate the through holes 142*x* of the circuit board 142, and in the bonding step P4, the frame 144 is bonded to the base 143 while the leading ends of the protrusions 143*x* are received by the holes 144*x* of the frame 144. This makes it possible to achieve, when manufacturing the circuit board unit 140, both the improvement in the alignment of the base 143, the frame 144, and the circuit board 142, and the simplification of the assembly operation of these components.

According to the manufacturing method of the circuit board unit 140 of the present embodiment, in the bonding step P4, the circuit board 142 is retained between the base 143 and the frame 144 via gaps formed in the orthogonal direction and in the surface direction. For this reason, even if in the bonding step P4 an external force (ultrasonic vibration in the present embodiment) is imparted to the frame 144 and the base 143, the external force is less likely to influence on the circuit board 142. Furthermore, because it is less necessary to take into account of the external force on the circuit board 142, it is possible in the bonding step P4 to firmly fix the frame 144 and the base 143 with each other with high bonding strength, and to firmly retain the circuit board 142 between these components.

In addition to the above, according to the manufacturing method of the circuit board unit 140 of the present embodiment, in the bonding step 94 gaps are formed along the entire outer periphery of the circuit board 142 in the surface direction. This makes it possible to certainly restrain the external force from influencing on the circuit board 142 in the bonding step P4.

According to the manufacturing method of the circuit board unit 140 of the present embodiment, in the bonding step P4 the receiver 502 is provided to oppose the frame 144 over the base 143 but not to oppose the circuit board 142 as shown in FIG. 13B. This farther ensures the restraint of the transfer of the ultrasonic vibration to the circuit board 142.

The cartridge 40 of the present embodiment includes the housing 41 including the lower housing 41*x* having the groove 41*x*1 and the upper housing 41*y* having the groove 41*y*1. Furthermore, according to the manufacturing method of the cartridge 40 of the present embodiment, parts of the outer periphery of the base 143 are received by the groove 41*x*1 of the lower housing 41*x* (see FIG. 5B), and then the upper housing 41*y* is attached to the lower housing 41*x* and the remaining part of the outer periphery of the base 143 are received by the groove 41*y*1 of the upper housing 41*y* (see 5A). In this way, the circuit board unit 140 is easily attached to the cartridge 40.

The cartridge 40 of the present embodiment is arranged so that the base 143 thereof is fixed to the lower housing 41*x* by thermally caulking the protruding portions 143*y* penetrating the through holes 41*x*2. Furthermore, according to the manufacturing method of the cartridge 40 of the present embodiment, in the first receiving step Q2 the protruding portions 143*y* of the base 143 are moved to penetrate the through holes 41*x*2 of the lower housing 41*x*. After the second receiving step Q5, the protruding portions 143*y* penetrating the through holes 41*x*2 are thermally caulked, an that the base 143 is fixed to the lower housing 41*x* (Q6). In this case, because in Q6 the external force generated on account of the pressurization is predominantly exerted to the base 143, it is possible to firmly fix the circuit board unit 140 to the cartridge 40 while restraining the external force from being imparted to the circuit board 142.

In addition, in the cartridge 40 of the present embodiment, as shown in FIG. 8A and FIG. 8B, the length Lx of the two partial orthogonal parts 41*c*3*x* provided to sandwich the terminals 170*c* to 177*c* in the sub-scanning direction (high-density alignment direction) are the longest among the partial orthogonal parts of the orthogonal part. When the terminals 170*c* to 177*c* are lined up in two alignment directions at different densities, the degree of freedom is low in the high-density alignment direction (sub-scanning direction in the present embodiment). (That is to say, the alignment of the terminals 170*c* to 177*c* must be highly precise in this direction.) For this reason, because the length Lx of the two partial orthogonal parts 41*c*3*x* corresponding to the high-density alignment direction is arranged to be the longest among the lengths of the partial orthogonal parts, high priority is given to the alignment in the high-density alignment direction, and hence the reliability of the contacts between the terminals 170*c* to 177*c* and the terminals 170*p* to 177*p* is improved.

In the present embodiment, the low-density alignment direction is a direction of the gravity (i.e., the vertical direction) when the cartridge 40 is attached to the housing 1*a*. That is to say, in the present embodiment the terminals 170*c* to 177*c* are aligned with a low density in the direction in which the alignment precision may be deteriorated on account of the gravity. The degree of freedom is therefore high in this direction and hence the deterioration of the alignment precision on account of the gravity is restrained.

According to the present embodiment, the housing 41*x* is provided with three partial orthogonal parts 41*c*3*x* and the housing 41*y* is provided with a single partial orthogonal part 41*c*3*y*. Furthermore, the three partial orthogonal parts 41*c*3*x* are longer in the orthogonal direction than the partial orthogonal part 41*c*3*y*. Because of this structure, the present embodiment makes it possible to simplify the structure as compared to a case where a plurality of partial orthogonal parts having different lengths in the orthogonal direction are formed on the housings 41*x* and 41*y*.

According to another embodiment, the base 143 may be integrated into one of the housing (e.g., the lower housing 41*x*). In this case, the circuit board 142 is supported by only one housing (lower housing 41*x*).

Now, a manufacturing method of the circuit board unit 140 according to another embodiment of the present invention will be described.

Figure 14A:
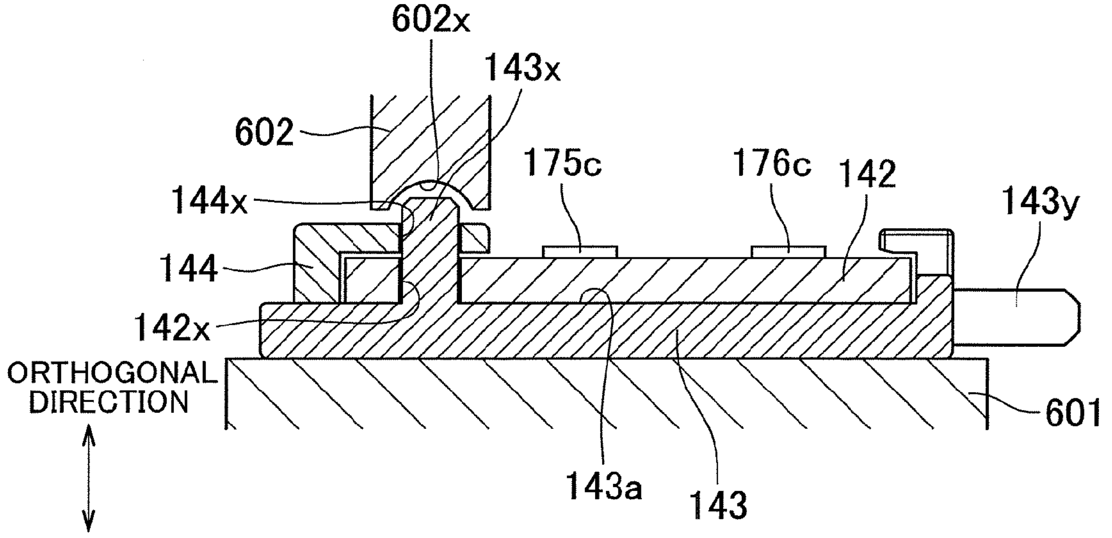
FIG. 14A and FIG. 14B are cross sections corresponding to FIG. 8B and show a bonding step of bonding the frame with the base by thermal caulking in a method of manufacturing a circuit board unit according to another embodiment of the present invention.
Figure 14B:
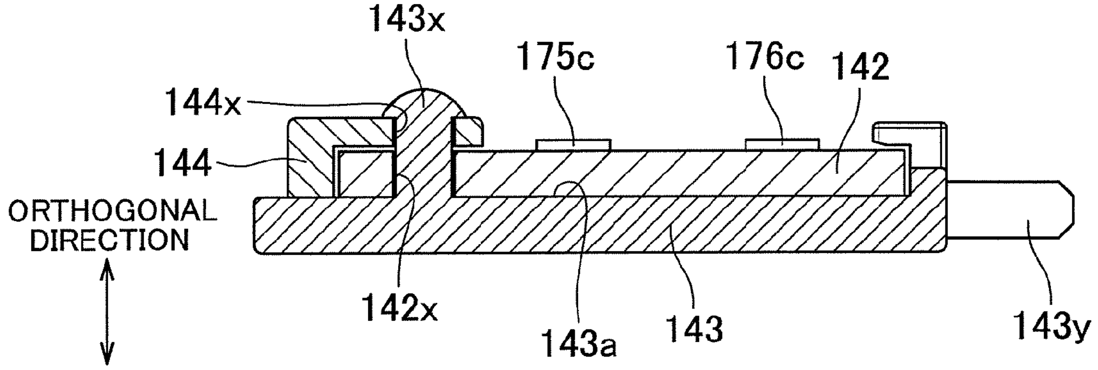

According to this embodiment, in the bonding step P4 the frame 144 is bonded to the base 143 not by ultrasonic welding but by thermal caulking. In so doing, as shown in FIG. 14A, the supporting member 601 is provided in advance on the bottom surface of the base 143 and the heating pressuring member 602 is provided in advance to oppose the two protrusions 143*x*. In this regard, the two concave portions 602*x* of the heating pressuring member 602 are arranged to oppose the leading ends of the two protrusions 143*x*, respectively. The base 143 in this state is heated and pressurized by using the heating pressuring member 602, with the result that the leading ends of the protrusions 143*x* are plastically deformed to conform in shape to the concave portion 602*x* as shown in FIG. 14B. With this, the enlarged parts of the leading ends of the protrusions 143*x* are engaged with the surface of the frame 144 and hence the frame 144 is fixed to the base 143.

According to a further embodiment, in the bonding step P4 the frame 144 is bonded to the base 143 by screwing. For example, as shown in FIG. 14A, after the circuit board 142, the base 143, and the frame 144 are disposed, a female screw is screwed into a male screw which is constituted by grooves formed at the leading end of each of the protrusions 143*x*.

It is possible in these embodiments to achieve effects similar to the above-described embodiment.

(Second Embodiment)

Now, the following will describe the overall structure of an inkjet printer 701 including a cartridge according to another embodiment of the present invention. The arrangements identical with those in the first embodiment above are denoted by the same reference numerals, and thus detailed description thereof will be hereinafter omitted.

Figure 15:
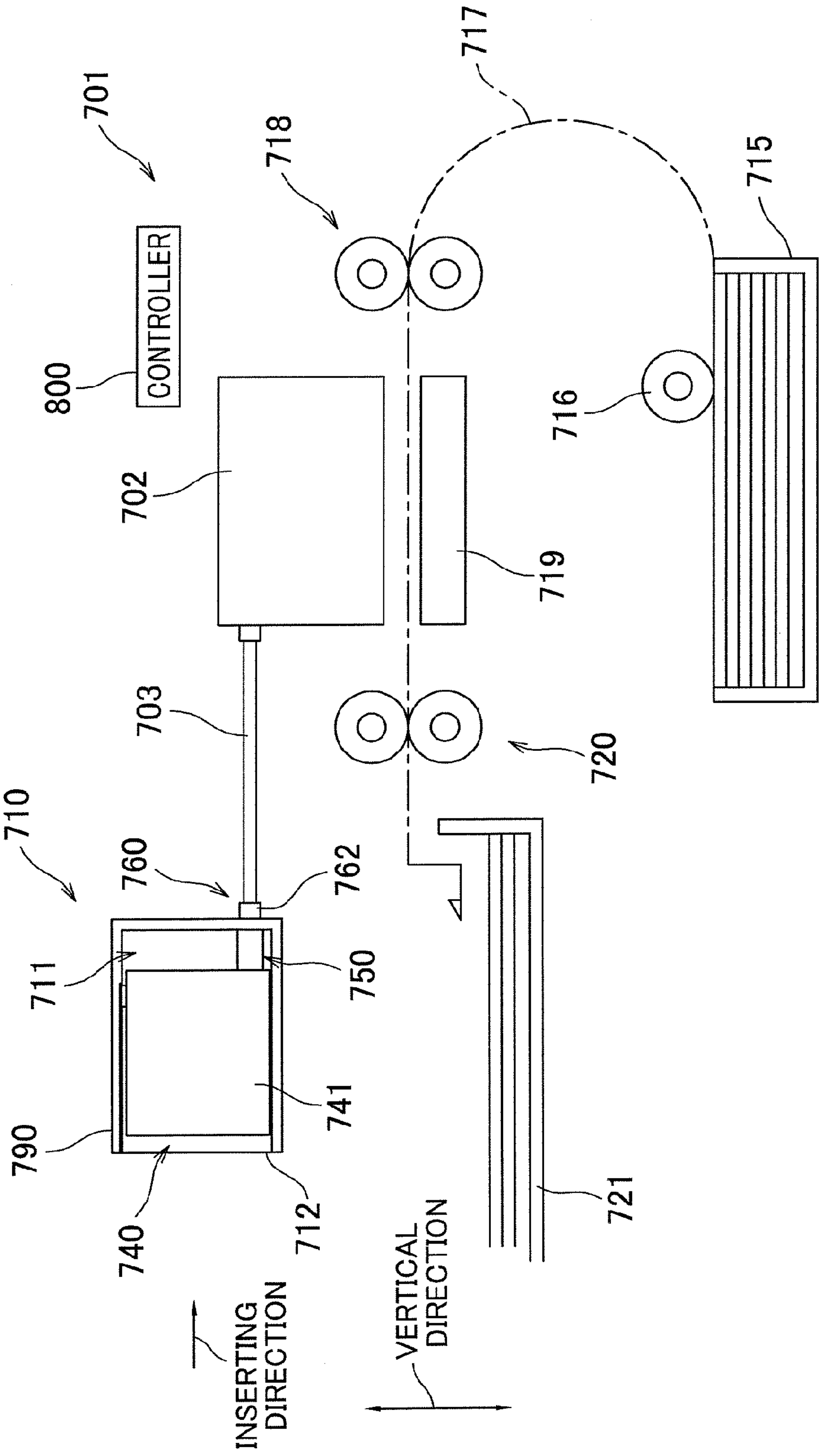
FIG. 15 schematically outlines an internal structure of an inkjet printer having a cartridge according to another embodiment of the present invention.

As shown in FIG. 15, a printer 701 records an image on a sheet by ejecting ink droplets from an inkjet head 702 onto the sheet conveyed from a sheet feeding tray 715. The printer 701 includes an ink supply unit 710. The ink supply unit 710 is provided with an attachment chamber 711 where a cartridge 740 is attached. The attachment chamber 711 has an opening 712 formed by opening one face of the chamber to the outside. The cartridge 740 is inserted into the attachment chamber 711 through the opening 712 in the rightward direction (inserting direction) in FIG. 15, and is attached to the attachment chamber 711. On the other hand, the cartridge 740 is taken out from the attachment chamber 711 by moving the cartridge 740 in the direction opposite to the inserting direction. In a housing 741 of the cartridge 740 is formed an ink storage chamber 742 (see FIG. 16). The ink storage chamber 742 is filled with black ink.

When the cartridge 740 is attached to the attachment chamber 711, the cartridge 740 is connected to the inkjet head 702 via an ink tube 703. In the inkjet head 702 is provided an unillustrated sub-tank. The sub-tank temporarily stores ink supplied from the cartridge 740 via the ink tube 703.

The printer 701 is provided with a controller 800. This controller 800 conducts control operations in a similar manner as the controller 100 of the first embodiment above. That is to say, the controller 800 controls a pickup roller 716, a conveyor roller pair 718. and an ejection roller pair 720 to move a sheet from a sheet feeding tray 715 to a sheet discharge tray 721 via a conveyance passage 717. The sheet sent out from the sheet feeding tray 715 by the pickup roller 716 to the conveyance passage 717 is conveyed onto the platen 719 by the conveyor roller pair 718. On the lower surface of the inkjet head 702 which surface opposes the platen 719, a plurality of ejection openings, which are not illustrated, are formed. Under the control of the controller 800, the inkjet head 702 selectively ejects ink droplets through the ejection openings onto the sheet passing on the platen 719, With this, an image is recorded on the sheet. The sheet having passed through the platen 719 is ejected to the sheet discharge tray 721 provided at the most downstream part of the conveyance passage 717, by the ejection roller pair 720.

The ink supply unit 710 is provided with the cartridge 740 and supplies the ink in the cartridge 740 to the inkjet head 702. FIG. 15 shows a state in which the cartridge 740 is attached to the attachment chamber 711.

Figure 16:
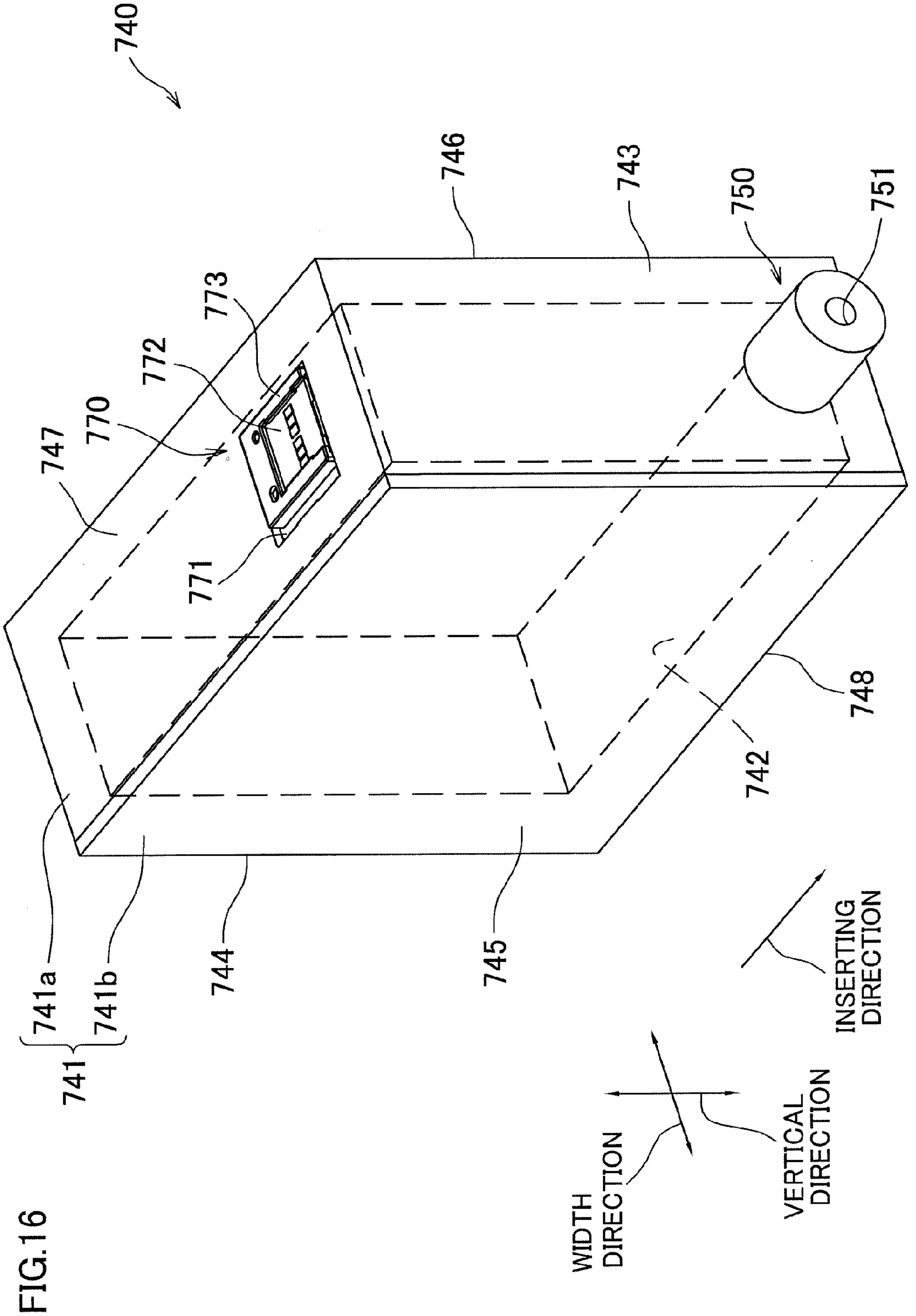
FIG. 16 is a perspective view of the cartridge shown in FIG. 15.

The cartridge 740 is in a standup state in FIG. 16. The cartridge 740 is inserted into the attachment chamber 711 in the inserting direction while the surface shown in the lower part of the figure is the bottom surface whereas the surface shown in the upper part of the figure is the upper surface. In other words, the cartridge 740 takes the standup state when attached to the attachment chamber 711. The height direction in the standup state is in parallel to the vertical direction.

The cartridge 740 has a housing 741 in which an ink storage chamber 742 is formed. The housing 741 is made up of a first housing 741*a* and a second housing 741*b*. The first housing 741*a* is rectangular parallelepiped in shape and is wider than the second housing 741*b* in the width direction which is orthogonal to the inserting direction in the horizontal plane. In the first housing 741*a* is formed a concave portion which functions as the ink storage chamber 742. The concave portion is open at one side in the width direction (left side in FIG. 16). The second housing 741*b* is a flat rectangular plate-shaped component and is sized to be sufficient to close the opening of the concave portion of the first housing 741*a*. As the second housing 741*b* is bonded to the first housing 741*a* to close the opening of the concave portion, the ink storage chamber 742 is defined in the housing 741. The opening of the concave portion of the first housing 741*a* is sealed by a flexible film 749 (see FIG. 22B).

In the cartridge 740, a surface of the housing 741 which is on the front side when the cartridge 740 is attached to the attachment chamber 711 is a leading end surface 743, whereas a surface of the housing 741 on the back side is a rear end surface 744. The surfaces of the housing 741 on the respective sides in the width direction are side surfaces 745 and 746, the surface on the upper side is an upper surface 747 of the housing 741, and the surface on the lower side is a bottom surface 748 of the housing 741.

On the leading end surface 743 of the housing 741 is formed an ink supplying unit 750. The ink supplying unit 750 is provided below the central part of the leading end surface 743 in the vertical direction. The ink supplying unit 750 is cylindrical in shape and protrudes from the leading end surface 743 in the inserting direction. At the protruding end of the ink supplying unit 750 is formed an ink supply opening 751.

Figure 18:
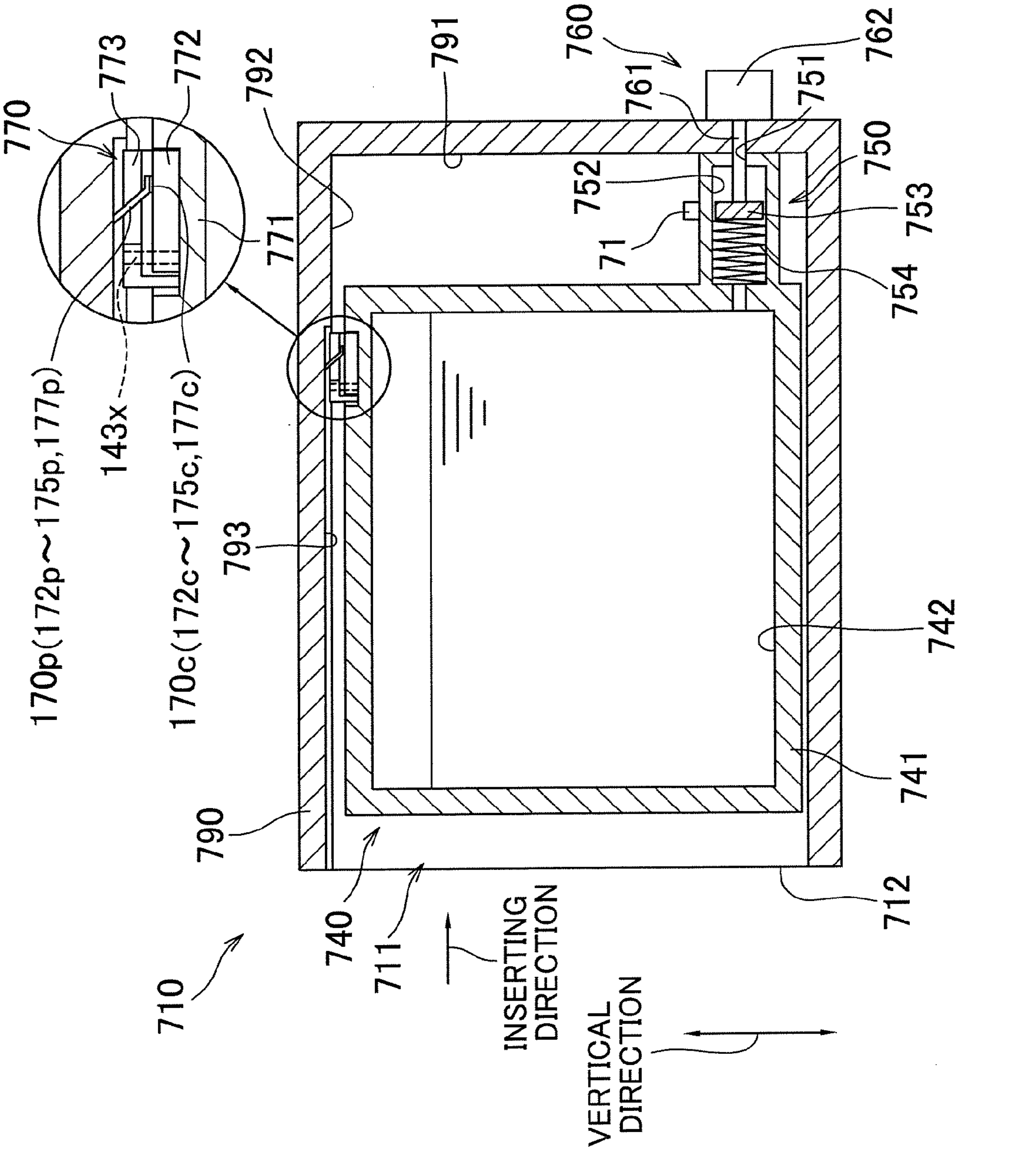
FIG. 18 is a schematic cross section showing a state in which a cartridge is attached to an attachment chamber of the ink supply unit shown in FIG. 15.

As shown in FIG. 18, the ink supplying unit 750 has an ink passage 752. The ink passage 752 extends in parallel to the inserting direction in the ink supplying unit 750 and connects the ink supply opening 751 with the ink storage chamber 742. The ink passage 752 is provided with an on-off valve 753 and a spring 754 that biases the on-off valve 753 toward the ink supply opening 751. The ink supply opening 751 is arranged to be openable and closable by the on-off valve 753 and the spring 754. When the cartridge 740 is attached to the attachment chamber 711, a hollow needle 761 provided in the attachment chamber 711 is inserted into the ink supply opening 751 so as to open the on-off valve 753. As a result, the ink in the ink storage chamber 742 flows into the hollow needle 761 via the ink passage 752.

It is noted that the ink supply opening 751 may not be opened and closed by the on-off valve 753. For example, the ink supply opening 751 is closed by a film, rubber stopper, or the like, and the hollow needle 761 breaks through the film or the like as the cartridge 740 is attached to the attachment chamber 711, with the result that the ink supply opening 751 is opened.

On the upper surface 747 of the housing 741 is provided a circuit board unit 770. This circuit board unit 770 includes a base region 771 which is integrated with the housing 741, i.e., a part of the housing 741, a circuit board 772, and a frame 773 which is a cover. The circuit board unit 770 is provided to be close to the downstream end in the inserting direction on the upper surface 747, i.e., on an orthogonal plane which is orthogonal to the thickness direction of the circuit board 772.

Figure 19:
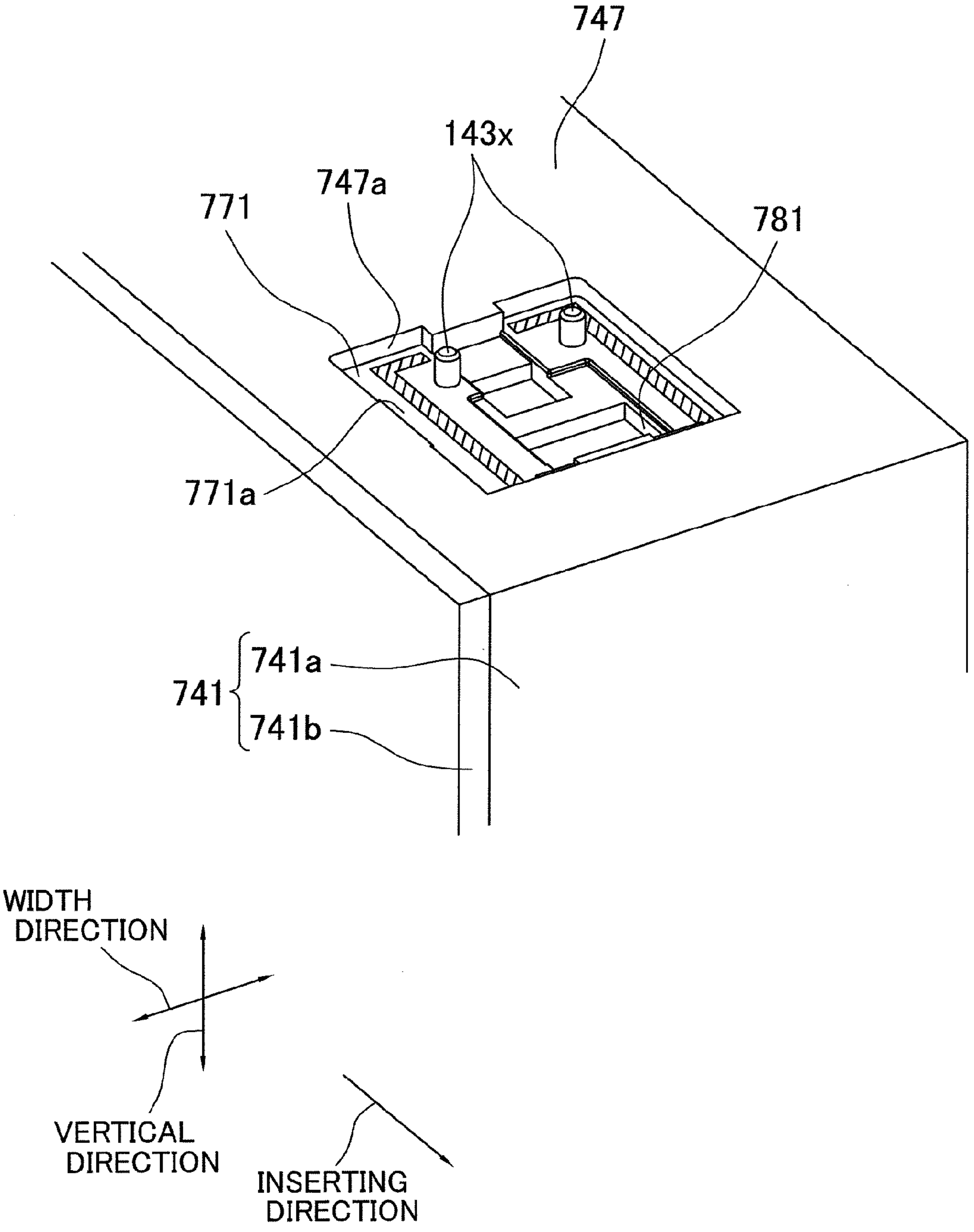
FIG. 19 is a perspective view of an essential part of the cartridge, showing a state before the circuit board and the frame are attached.

As shown in FIG. 19, the base region 771 is a bottom surface part of a concave region 747*a* of the upper surface 747 of the housing 741. This base region 771 is substantially identical in shape with the surface 143*a* of the base 143 above. In other words, the surface 771*a* of the base region 771 corresponds to the surface 143*a*. Another difference therebetween is in that, on the surface 771*a* of the base region 771, a concave portion 781 is formed instead of the opening 143*z*. As shown in FIG. 22, the concave portion 781 is provided at a position opposing a memory 141 which is provided on a back surface 772*b* of the circuit board 772 which surface is opposite to the surface 772*a*, The concave portion 781 has a depth with which the memory 141 does not contact the bottom surface when the circuit board 772 is mounted on the surface 771*a*. Furthermore, the concave portion 781 is open in such a way that, while the memory 141 is positioned at the concave portion 781, the inner circumferential surface of the concave portion 781 is distanced from the memory 141 for at least predetermined distances (each of which is, for example, 0.4 mm and is longer than the separation distance between the corresponding protrusion 143*x* and the inner circumferential surface of the hole 142*x*) in the in-plane directions of the upper surface 747 (i.e., the direction in parallel to the inserting direction and the width direction). With this, in a similar manner as the first embodiment above, even if the circuit board 772 is moved for 0.2 mm (which is the separation distance between the protrusion 143*x* and the inner circumferential surface of the hole 142*x*) in an in-plane direction of the upper surface 747, the memory 141 still opposes the concave portion 781 and, for example, the memory 141 does not contact the base region 771 at the time of ultrasonic welding. This makes it possible to prevent the memory 141 from dropping off or being broken at the time of manufacturing the cartridge 740 and after the completion of the manufacturing.

The concave region 747*a* has a depth with which the surface 772*a* of the circuit board 772 is flush with the upper surface 747 when the circuit board 772 is fitted into the concave region 747*a* and the circuit board 772 is mounted on the base region 771. This reduces the degree of protrusion of the cartridge 740 of the circuit board unit 770 from the upper surface 747. The redundant space inside the attachment chamber 711 is therefore reduced. Furthermore, because the concave region 747*a* is not too deep, the capacity of the ink storage chamber 742 is suitably secured and the cartridge 740 is allowed to store a larger amount of ink. Furthermore, the base region 771 is provided with two protrusions 143*x* similar to those in the first embodiment above, to restrict the movement of the circuit board 772 in in-plane directions of the upper surface 747 (i.e., directions orthogonal to the thickness direction of the circuit board 772). Also in the present embodiment, the two protrusions 43*x* function as regulating walls that regulate the movement of the circuit board 772 in the in-plane directions of the upper surface 747, in a similar manner as in the first embodiment above.

Figure 20:
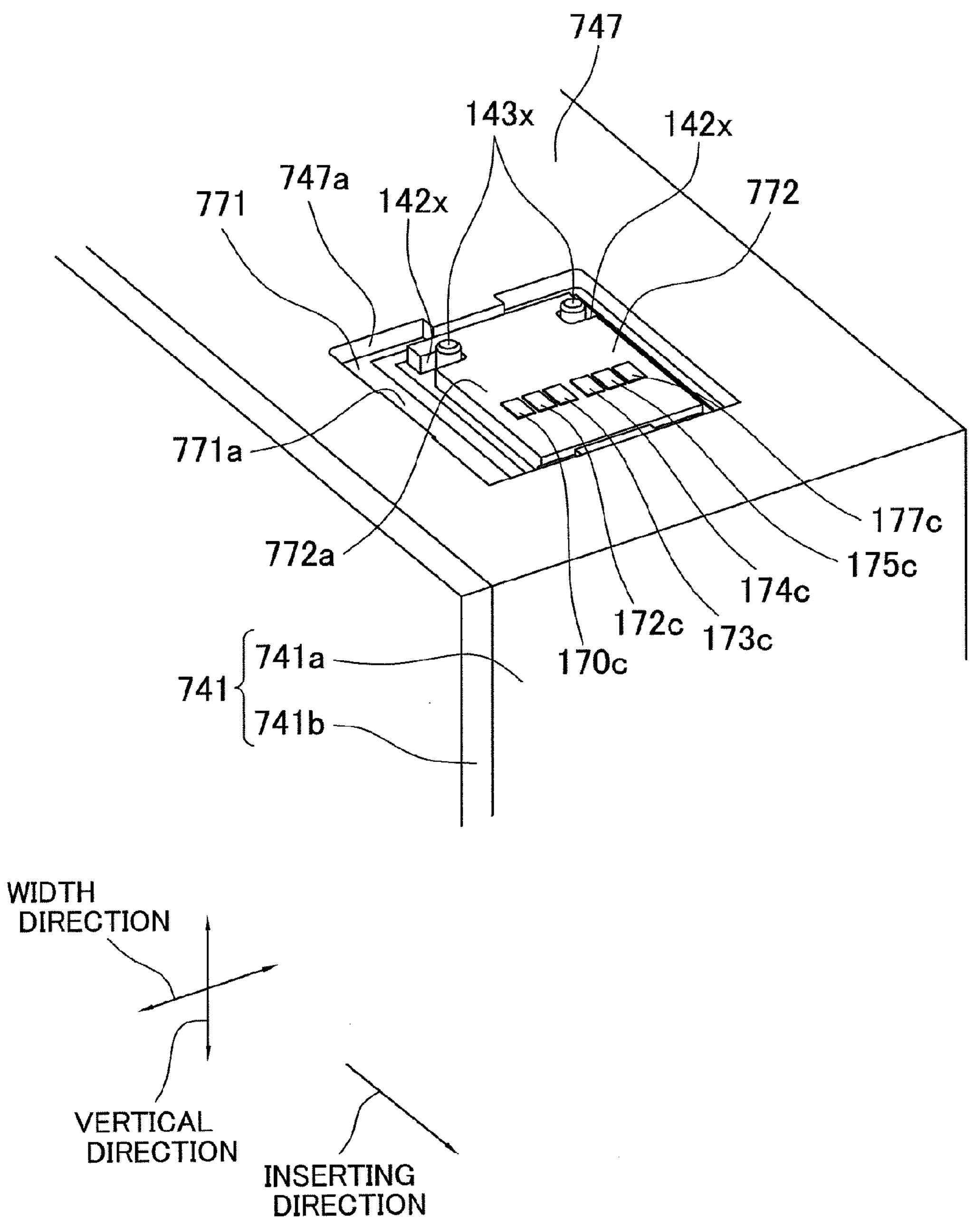
FIG. 20 is a perspective view of an essential part of the cartridge, showing a state in which only the circuit board is attached to the base region.

As shown in FIG. 20, the circuit board 772 is substantially identical with the circuit board 142, except that the number of terminals formed is different from the number in the circuit board 142 above. On the surface 772*a* of the circuit board 772 are formed six terminals 170*c*, 172*c* to 175*c*, and 177*c*, whereas on the back surface 772*b* is mounted the memory 141. Furthermore, the circuit board 772 is attached to the surface 771*a* of the base region 771 so that the six terminals 170*c*, 172*c* to 175*c*, and 177*c* on the surface 772*a* are exposed. The six terminals 170*c*, 172*c* to 175*c*, and 177*c* are provided to form a single line along the width direction on the surface 772*a*. The circuit board 772 is disposed so that the surface 772*a* faces up. In other words, the circuit board 772 is mounted on the base region 771 so that the back surface 772*b* of the circuit board 772 opposes the surface 771*a* of the base region 771.

On the outer circumferential surface of the ink supplying unit 750 is provided the above-described Hall effect sensor 71. This Hall effect sensor 71 generates, in a similar manner as the first embodiment above, an electric signal having a signal intensity corresponding to the position of the on-off valve 753. Based on this electric signal, the controller 800 determines whether the on-off valve 753 is at the open position, in a similar manner as the controller 100 above. It is noted that the electric connections between the terminals 170*c*, 174*c*, 175*c*, and the 177*c* and the Hall effect sensor 71 is achieved by a flexible cable, in a similar manner as above. The electric connections between the terminals 172*c*, 173*c*, 174*c*, 175*c*, and 177*c* and the memory 141 are achieved by a conductive material filling a through hole penetrating the circuit board 772.

The circuit board 772 has two holes 142*x* similar to those in the first embodiment above. The relationship between the holes 142*x* and the protrusions 143*x* of the base region 771 is identical with the relationship in the first embodiment above. Therefore, on account of the two protrusions 143*x* functioning as the regulating walls, the movement of the circuit board 772 in the in-plane directions of the upper surface 747 is regulated so that a part (i.e., a peripheral part) of the surface 772*a* of the circuit board 772 opposes a later-described opposing surface 773*b* whereas the six terminals 170*c*, 172*c* to 175*c*, and 177*c* are exposed without opposing the opposing surface 773*b*.

As a variation, non-through holes, i.e., concave portions may be formed on the back surface 772*b* of the circuit board 772, in place of the holes 142*x*. In such a case, the protrusions 143*x* may protrude from the surface 771*a* such that the leading ends thereof are closer to the surface 771*a* than to the surface 772*a* of the circuit board 772. The same effects are achieved with this arrangement, in comparison with the holes 142*x*.

Figure 21:
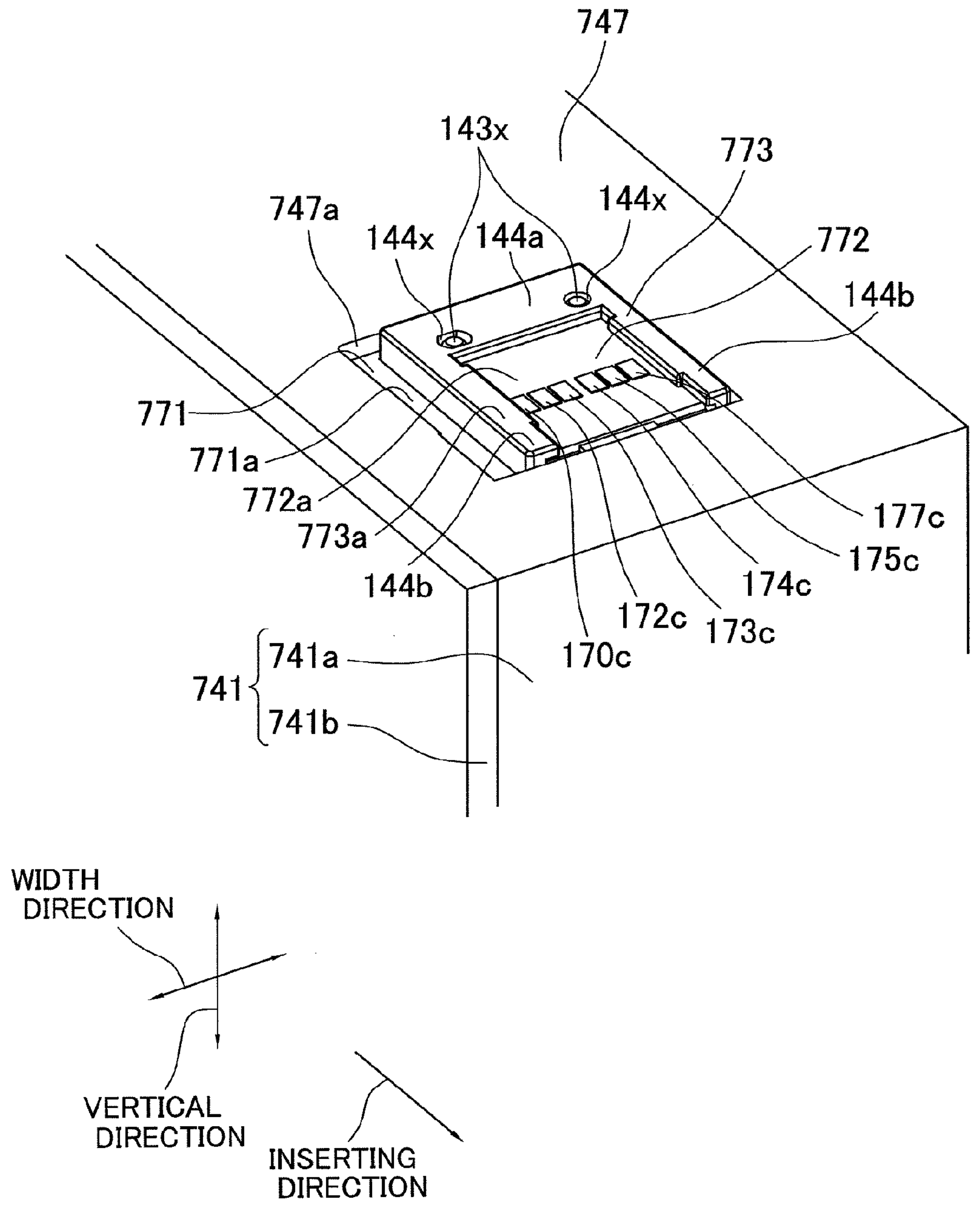
FIG. 21 is a perspective view around a circuit board unit of the cartridge.
Figure 22A:
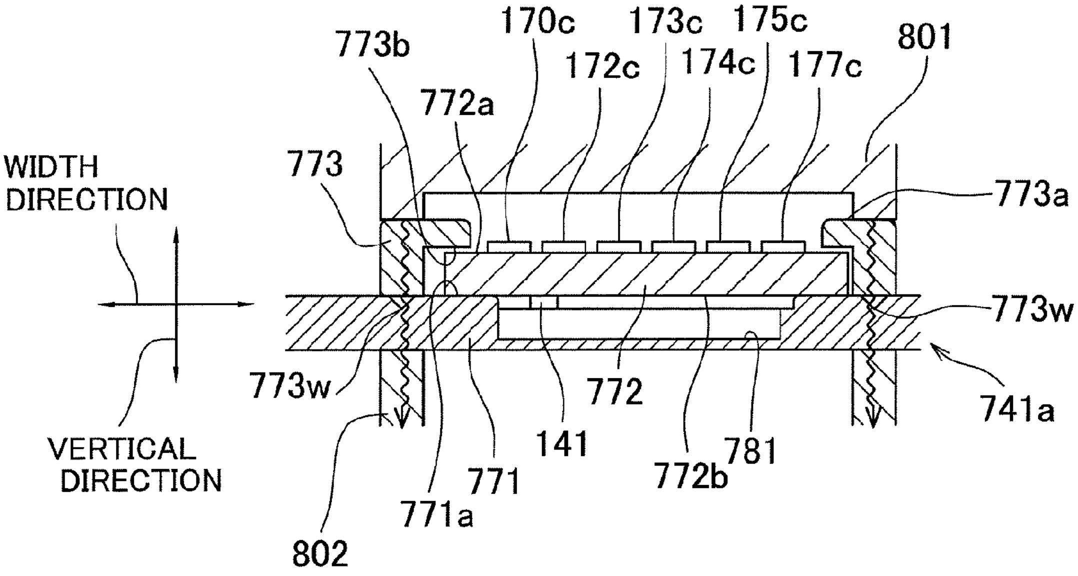
FIG. 22A is a partial cross section for illustrating the second step.
Figure 22B:
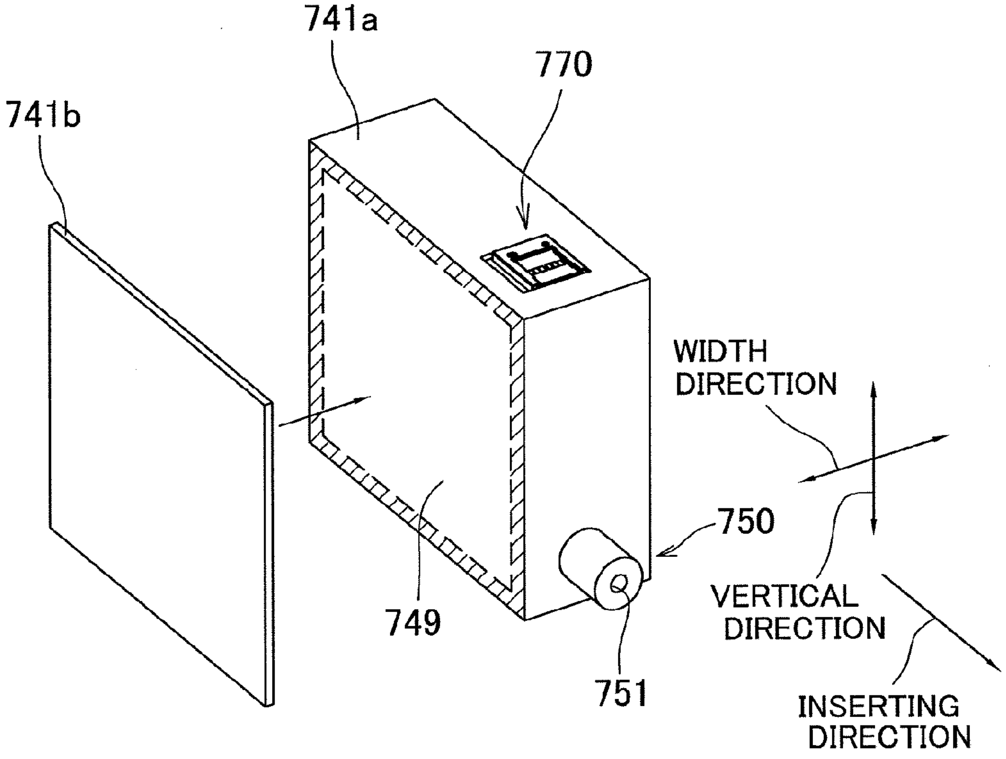
FIG. 22B is a schematic perspective view showing a state when a and a second housing are bonded to a first housing.

The frame 773 which is a cover is, as shown in FIG. 21, substantially identical with the frame 144 described in the first embodiment above. The frame 773 is bonded by ultrasonic bonding to a region of the surface 771*a* which region is different from a region opposing the circuit board 772 (i.e., bonded to the periphery of the circuit board 772). In FIG. 19, the region of the base region 771 of the surface 771*a* to which the frame 773 is bonded is shown hatched. Furthermore, FIG. 22A shows a welded part 773*w* of the frame 773. In a similar manner as in the first embodiment above, the frame 773 is disposed not to oppose the six terminals 170*c*, 172*c* to 175*c*, and 177*c* of the circuit board 772 but to oppose the peripheral part of the circuit board 772. The frame 773 has an opposing surface 773*b* opposing the circuit board 772. In a similar manner as in the first embodiment above, the distance between the opposing surface 773*b* and the surface 771*a* in the thickness direction of the circuit board 772 is longer than the thickness of the circuit board 772. The frame 773 is fixed to the surface 771*a* at three out of four sides of the rectangular surface 771*a*, i.e., except at the downstream side in the inserting direction. In other words, between the terminals 170*c*, 172*c* to 175*c*, and 177*c* and the downstream end of the upper surface 747 in the inserting direction, the frame 773 does not overlap, in the width direction, the range where the terminals 170*c*, 172*c* to 175*c*, and 1.77*c* are formed. Therefore the frame 773 does not obstruct the contact between the terminals 170*c*, 172*c* to 175*c*, and 177*c* and the terminals 170*p*, 172*p* to 175*p*, and 177*p* when the cartridge 740 is attached to the attachment chamber 711. This allows the two groups of terminals to smoothly contact one another.

In a similar manner as in the first embodiment above, the circuit board 772 is not fixed to the base region 771 and the frame 773 and is supported at the space between the base region 771 and the frame 773 with gaps in the vertical direction and the in-plane direction of the upper surface 747 (see FIG. 22A).

The relationship among the dimensions in the sub-scanning direction, which has been described in the first embodiment with reference to FIG. 9B, also holds in the present embodiment. However, because in the present embodiment a component equivalent to the hook 143*f* of the first embodiment is not provided, only one inequality (Ky−Sy<cy<ay) holds in the vertical direction. In this case, a surface that defines one end of the distance Ky and is equivalent to the inner surface 144*b*3 in FIG. 9B is an inner surface of the concave region 747*a* of the upper surface 747 of the housing 741, which inner surface is provided at the downstream end in the inserting direction.

Figure 17:
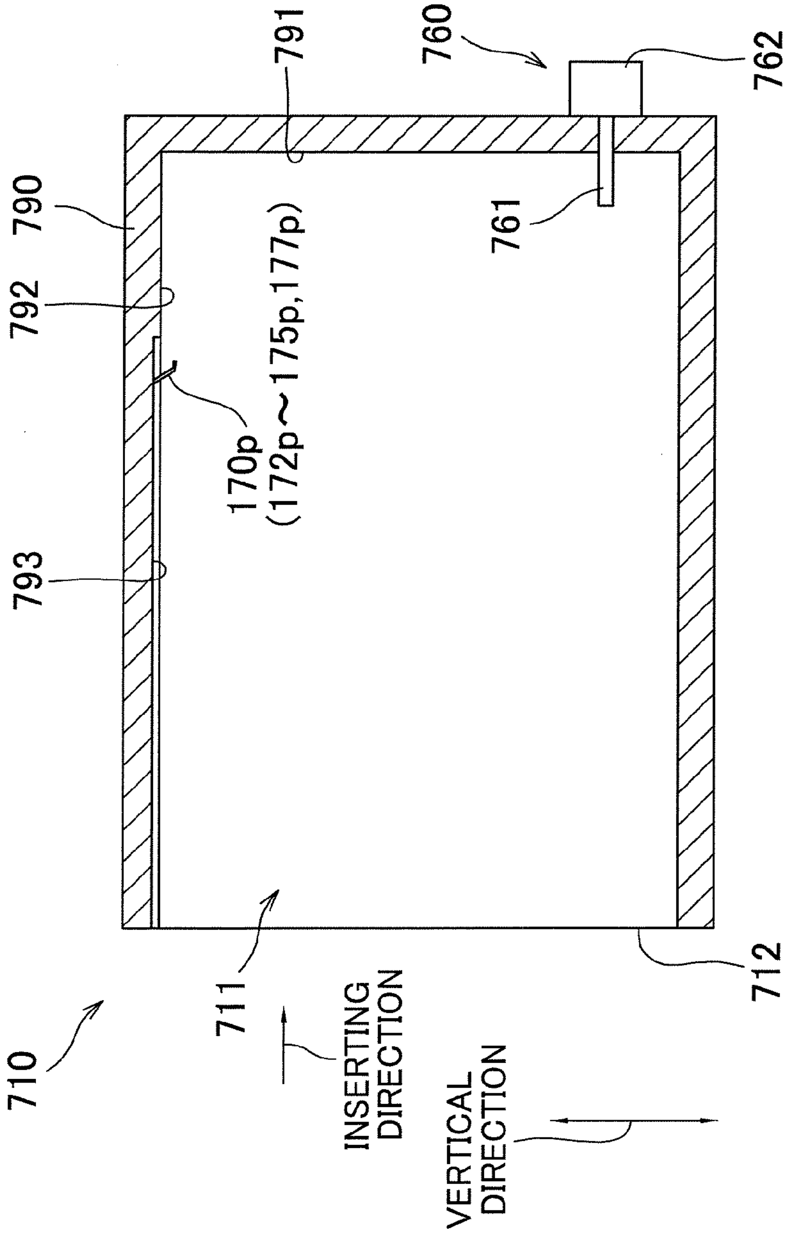
FIG. 17 is a schematic cross section of the ink supply unit shown in FIG. 15.

The attachment chamber 711 is, as shown in FIG. 17, defined by the inner surfaces of a case 790. The case 790 is a box having an opening 712 which is open toward the front of the printer 701 (i.e., leftward in FIG. 15). At an end surface 791 at the downstream end in the inserting direction, which is an inner surface of the case 790, a connecting portion 760 is formed, This connecting portion 760 is formed to be below the central part of the end surface 791 and to oppose the ink supplying unit 750 in the inserting direction.

The connecting portion 760 has a hollow needle 761 and a connecting portion 762. The hollow needle 761 extends in the inserting direction and penetrates the end surface 791 of the case 790. The connecting portion 762 is fixed to an outer surface of the case 790 which surface is opposite to the end surface 791, to connect the ink tube 703 with the hollow needle 761.

As the cartridge 740 is inserted into the attachment chamber 711, the hollow needle 761 is inserted into the ink supply opening 751. When the cartridge 740 is attached to the attachment chamber 711 as the cartridge 740 is inserted until the protruding end of the ink supplying unit 750 contacts the end surface 791, the hollow needle 761 moves the on-off valve 753 to the open position against the biasing force of the spring 754. As a result, the ink in the ink storage chamber 742 flows into the hollow needle 760 via the ink passage 752. The ink therefore flows into the inkjet head 702 via the ink tube 703.

On a ceiling surface 792 which is an inner surface of the case 790, a groove 793 and spring-shaped terminals 170*p*, 172*p* to 175*p*, and 177*p* are provided. When the cartridge 740 is attached to the attachment chamber 711, the groove 793 extends along the inserting direction from the opening 712 and reaches a position which is slightly downstream of a part opposing the downstream end of the circuit board unit 770. The groove 793 is slightly wider than the frame 773 in the width direction. Furthermore, the center of the groove 793 in the width direction overlaps the center of the frame 773 in the width direction. Furthermore, the groove 793 has a depth with which the case 790 does not contact the circuit board unit 770 of the cartridge 740 attached to the attachment chamber 711. With this, the frame 773 does not contact the case 790 when the cartridge 740 is inserted into the attachment chamber 711.

When the cartridge 740 is attached to the attachment chamber 711, the terminals 170*p*, 172*p* to 175*p*, and 177*p* are disposed at around the downstream end of the groove 793 in the inserting direction. More specifically, the terminals 170*p*, 172*p* to 175*p*, and 177*p* are provided to form a single line extending along the width direction, and are disposed to oppose the terminals 170*c*, 172*c* to 175*c*, and 177*c* of the circuit board unit 770, respectively, as shown in FIG. 18. Therefore, when the cartridge 740 is attached to the attachment chamber 711, the groups of the terminals contact one another and the electrical connections therebetween are established in a similar manner as the first embodiment above.

Now, a manufacturing method of the cartridge 740 according to the present embodiment will be described. To begin with, a first housing 741*a* having a base region 771, a circuit board 772, a frame 773, a film 749, and a second housing 741*b* are prepared (preparation step). After the preparation step, an unillustrated flexible cable is connected to the circuit board 772. In so doing, the wires of the flexible cable are electrically connected to terminals 170*c*, 174*c*, 175*c*, and 177*c* of the circuit board 772 (first connection step).

After the first connection step, the circuit board 772 is moved to oppose the surface 771*a* of the base region 771 and is mounted on the surface 771*a* (mounting step or first step). In so doing, in a similar manner as in the first embodiment above, the circuit board 772 is provided on the surface 771*a* so that the movement of the circuit board 772 in the in-plane directions of the upper surface 747 is regulated by two protrusions 143*x*. In other words, the protrusions 143*x* penetrate holes 142*x*. After the mounting step, a frame 773 having an opposing surface 773*b* which opposes the surface 772*a* of the circuit board 772 in the thickness direction of the circuit board 772 is mounted on the base region 771 while causing holes 144*x* to receive the protrusions 143*x*, and the frame 773 is bonded to a region of the surface 771*a* of the base region 771, which region is shown hatched in FIG. 19 (bonding step or second step).

In the bonding step, between the base region 771 and the frame 773, the circuit board 772 is supported with gaps in the vertical direction and the in-plane direction of the upper surface 747 (see FIG. 22A). In the present embodiment, gaps are secured along the entirety of the outer periphery of the circuit board 772. That is to say, in the bonding step, in a similar manner as in the first embodiment above, the distance between the opposing surface 773*b* of the frame 773 and the surface 771*a* of the base region 771 in the vertical direction is arranged to be longer than the thickness of the circuit board 772, while keeping a part of the surface 772*a* of the circuit board 772 to oppose the opposing surface 773*b* and keeping the six terminals 170*c*, 172*c* to 175*c*, and 177*c* to be exposed without opposing the opposing surface 773*b*.

In the bonding step, as shown in FIG. 22A, generator 801 is provided in advance on the surface 773*a* of the frame 773, and a receiver 802 is provided at a part of the base region 771, which part opposes the bonding region (shown hatched in FIG. 19), on the back surface of the base region 771 (i.e., the surface opposite to the surface 771*a*). When ultrasonic waves are generated in this state by a generator 801, the ultrasonic waves pass through the frame 773 and the base region 771 and are eventually received by the receiver 802. In so doing, the ultrasonic waves reach the frame 773 and the bonding region of the base region 771, with the result that a part of the frame 773 which part contacts the base region 771 is molten. With this, the frame 773 is bonded to the base region 771 and the welded part 773*w* is formed on the frame 773. As such, the frame 773 is bonded by ultrasonic welding in the present embodiment. Therefore the frame 773 is easily and certainly fixed to the housing 741 (base region 771).

The manufacturing of the circuit board unit 770 is completed through the steps above.

After the bonding step, a peripheral part (shown hatched in FIG. 22B) of the opening of the concave portion (ink storage chamber 742) of the first housing 741*a* to which the circuit board unit 770 is bonded is bonded to a film (film bonding step). The opening of the concave portion is sealed by this operation. After the film bonding step, the second housing 741*b* is bonded to the first housing 741*a* (housing bonding step). It is noted that, in the film bonding step and the housing bonding step, the bonding between the film and the first housing 741*a* and the bonding between the first housing 741*a* and the second housing 741*b* may be achieved by thermal welding or by using an adhesive. Furthermore, when the film is firmly bonded to the first housing 741*a*, the first housing 741*a* may be bonded to the second housing 741*b* by screwing.

After the housing bonding step, wires of the unillustrated flexible cable are electrically connected with the Hall effect sensor 71 (second connection step). After the second connection step, the ink storage chamber 742 is filled with the ink supplied from the ink supply opening 751.

The manufacturing of the cartridge 740 is completed through the steps above.

As described above, in the cartridge 740 including the circuit board unit 770 of the present embodiment, the circuit board 772 is fixed to none of the base region 771 and the frame 773, and is supported at the space between the base region 771 and the frame 773 with gaps (margins), in a similar manner as the first embodiment. Therefore the circuit board 772 is less likely to receive stress and hence the degradation of the circuit board 772 and the electronic component (such as the memory 141, the terminals 170*c*, 172*c* to 175*c*, and 177*c*) mounted on the circuit board 772 is restrained. Furthermore, also in the circuit board unit 770 of the present embodiment, the circuit board 772 is less likely to receive stress not only when the cartridge 740 is manufactured but also when the cartridge 740 is conveyed and when the cartridge 740 is being attached to the attachment chamber 711. It is therefore possible to attain the effects similar to those in the first embodiment above. It is noted that the arrangements similar to those in the first embodiment above produce similar effects.

In addition to the above, because the movement of the circuit board 772 is regulated by the two protrusions 143*x* and the two holes 142*x*, it is possible to effectively restrain the degradation of the circuit board 772 and the electronic component mounted on the circuit board. 772. Furthermore, the regulation of the movement of the circuit board 772 with respect to the base region 771 is certainly achieved by a simple structure constituted by the protrusions 143*x* and the holes 142*x*.

According to the manufacturing method of the cartridge 740 of the present embodiment, in the bonding step, the circuit board 772 is supported in the space between the base region 771 and the frame 773 with gaps in the vertical direction and the in-plane direction of the upper surface 747. For this reason, in the bonding step, while an external force (ultrasonic vibrations in the present embodiment) is exerted to the frame 773 and the base region 771, the external force is less likely to be exerted to the circuit board 772. Furthermore, because it is not necessary to seriously taking account of the external force on the circuit board 772, it is possible to firmly fix the frame 773 to the base region 771 with a high bonding strength in the bonding step, and therefore the circuit board 772 is firmly supported between these components.

Variations of the embodiments above will be described.

The circuit board unit may be arranged as follows.

While in the two embodiments above the regulating walls are the pair of projections 144*b*, the main body 144*a* and the hook 143*f*, and the two protrusions 143*x* provided on the base 771, the regulating walls may be at least one set of the components above, or may be provided at other components. Furthermore, while in the two embodiments above the distance between the pair of projections 144*b* in which the circuit board 142 is movable in the sub-scanning direction and the distance between the main body 144*a* and the hook 143*f* in which the circuit board 142 is movable in the vertical direction are identical with the distances defined by the two protrusions 143*x* in which the circuit board 142 is movable in the sub-scanning direction and in the vertical direction, the former distances may be different from the latter distances. In such a case, the components defining the shorter distance in each direction function as the regulating walls.

Also in the cartridge of the second embodiment, in a similar manner as in the first embodiment, both of the relationship among dimensions in the sub-scanning direction ($Kx-Sx<cx<ax$ and $Kx-Sx<dx<bx$) and the relationship among the dimensions in the vertical direction ($Ky-Sy<cy<ay$ and $Ky-Sy<dy<by$) may hold. In such a case, for example, on the inner surface of the concave portion 747*a* which surface is at the downstream end in the inserting direction, a portion (whose lower surface is the fourth region of the opposing surface) which extends in the insetting direction in a similar manner as the hook 143*f* in the first embodiment is formed.

As long as the one or more terminals are exposed without opposing the opposing surface and a part of the terminal surface of the circuit board opposes the opposing surface, in the first embodiment one or both of the inequalities ($Kx-Sx<cx<ax$ and $Kx-Sx<dx<bx$) representing the relationship among dimensions in the sub-scanning direction may hold whereas one or both of the inequalities ($Ky-Sy<cy<ay$ and $Ky-Sy<dy<by$) representing the relationship among the dimensions in the vertical direction may not hold. In such a case, in the vertical direction, the movement of the circuit board 142 may be regulated by the engagement of the two protrusions 143*x* with the holes 142*x*, for example. Furthermore, in the first embodiment one or both of the inequalities ($Ky-Sy<cy<ay$ and $Ky-Sy<dy<by$) representing the relationship among the dimensions in the vertical direction may hold whereas one or both of the inequalities ($Kx-Sx<cx<ax$ and $Kx-Sx<dx<bx$) representing the relationship among dimensions in the sub-scanning direction may not hold. Also in this case, in the sub-scanning direction, the movement of the circuit board 142 may be regulated by the engagement of the two protrusions 143*x* with the holes 142*x*, for example. In a similar manner, as long as the one or more terminals are exposed without opposing the opposing surface and a part of the terminal surface of the circuit board opposes the opposing surface, in the second embodiment one or both of the inequalities ($Kx-Sx<cx<ax$ and $Kx-Sx<dx<bx$) representing the relationship among dimensions in the sub-scanning direction may hold whereas one or both of the inequalities ($Ky-Sy<cy<ay$ and $Ky-Sy<dy<by$) representing the relationship among the dimensions in the vertical direction may not hold. Furthermore, in the second embodiment one or both of the inequalities (Ky−Sy<cy<ay and Ky−Sy<dy<by) representing the relationship among the dimensions in the vertical direction may hold whereas one or both of the inequalities (Kx−Sx<cx<ax and Kx−Sx<dx<bx) representing the relationship among dimensions in the sub-scanning direction may not hold.

While in the two embodiments above gaps are formed between the two protrusions 143$x$ functioning as the regulating walls and the circuit board 142, 772 and the regulating walls allow the circuit board 142, 772 to move for 0.2 mm in the vertical direction and the sub-scanning direction, no gap may be formed between the regulating walls and the circuit board 112, 772 and the regulating walls may not allow the circuit board 142, 772 to move in both the vertical direction and the sub-scanning direction. Furthermore, the regulating walls may allow the circuit board 142, 772 to move only in the in-plane direction of the circuit board (i.e., in the direction orthogonal to the thickness direction of the circuit board 772), i.e., only one of the surface directions.

While in the second embodiment the concave region 747$a$ is formed at the upper surface 747 of the housing 741 and the circuit board 772 is fitted into the concave region 747$a$, this concave region may not be formed at the upper surface 747 of the housing 741.

The number, shape, and arrangement of the terminals mounted on the circuit board may be suitably changed. For example, the terminals may be provided at regular intervals (i.e., in the same densities) in both alignment directions.

The data stored in the memory mounted on the circuit board is not particularly limited. For example, the memory may store information such as the date of manufacture of a cartridge and the number of times the hollow needle 153 has been inserted into the stopper.

The electronic component mounted on the circuit board is not limited to the memory and the terminals, and may therefore be any other electronic components. Furthermore, the position of the electronic component on the circuit board is not particularly limited.

The first member and the second member are bonded with each other by welding, thermal caulking, screwing, or any combination thereof. Furthermore, the bonding may be achieved, by a method other than the welding, thermal caulking, and screwing (e.g., bonding may be achieved by an adhesive or the like).

The first member, the second member, and the circuit board may be arbitrarily shaped. For example, while the second member has through holes 144$x$ in the embodiments above to receive the protrusions 143$x$, the holes may be non-through holes or may not be formed.

The arrangement concerning the alignment of the first member, the second member, and the circuit board is not limited to the combination of the protrusions 143$x$ and the holes 142 and 144$x$ as in the embodiments above. Furthermore, each of the first member, the second member, and the circuit board may not have an arrangement for the alignment. For example, the protrusions 143$x$ of the first member 144, the holes 144$x$ of the second member, and the holes 142$x$ of the circuit board 142 may be omitted.

The manufacturing method of the circuit board may be arranged as follows.

In the circuit board mounting step, instead of moving the protrusions 143$x$ to penetrate the holes 142$x$, the alignment of the circuit board may be achieved by another method.

in the bonding step, gaps are not necessarily formed along the entirety of the outer periphery of the circuit board. In other words, gaps in the orthogonal direction and the surface direction may be formed only at parts of the outer periphery of the circuit board.

In the bonding step, the second member may be bonded to the first member by a combination of welding, thermal caulking, and screwing, or by a method different from welding, thermal caulking, and screwing (e.g., by a bonding method using an adhesive or the like).

The generator and the receiver may be sized and shaped in accordance with the sizes, shapes, or the like of the first member and the second member.

Furthermore, the receiver may be positioned to oppose the circuit board.

The cartridge may be arranged as follows.

Regarding the alignment directions of the terminals on the cartridge, the low-density alignment direction is not limited to a direction of gravity when the cartridge is attached to the main body. The low-density alignment direction may be in parallel to the main scanning direction or the sub-scanning direction. Furthermore, the number, shape, arrangement or the like of the terminals on the cartridge may be arbitrarily changed.

The length of the partial orthogonal parts sandwiching the terminals on the cartridge in the low-density alignment direction may be arbitrarily arranged on condition that, as described in the first embodiment above, at least one of the partial orthogonal parts (see FIG. 8B; the length Ly of the partial orthogonal part 41$c$3$y$) is shorter than the partial orthogonal parts (see FIG. 8A; the length Lx of the partial orthogonal parts 41$c$3$x$) sandwiching the terminals on the cartridge in the high-density alignment direction.

The number of types of the lengths of the partial orthogonal parts is not limited to two.

There may be three or more types of lengths.

The first housing and/or the second housing may have a plurality of partial orthogonal parts haying different lengths in the orthogonal direction.

The peripheral wall of the housing may be constituted by only the orthogonal part or the inclined part. Furthermore, the orthogonal part may be identical in length in the orthogonal direction (i.e., may not include a plurality of partial orthogonal parts which are different in length in the orthogonal direction).

The circuit board unit may be fixed to the housing of the cartridge by a method other than thermal caulking (e.g., welding).

The liquids stored in the housing are not limited to the black ink and the preprocessing liquid. The housing may store liquids such as ink with a color other than black, a post-processing liquid ejected onto a recording medium after the recording in order to improve the image quality, and a cleaning solution for cleaning the conveyance belt.

The number of liquid storages in the housing (i.e., the reservoirs 42 in the embodiments above) is not limited to two. The number of liquid storages may be one, or three or more.

The housing may not be provided with the liquid, storages in which liquids are stored, The housing may directly store liquid.

The liquid ejection apparatus to which the cartridge of the present invention is attached may be a color inkjet printer including heads ejecting black ink and inks with three colors (magenta, cyan, and yellow). Furthermore, the liquid ejection apparatus may be a line-type apparatus or a serial-type apparatus. The liquid ejection apparatus is not limited to printers, and may be any other types of liquid ejection apparatuses such as facsimile machines and photocopiers. The cartridge of the present invention may be used for storing not only liquid such as ink but also powder such as toner and gas.

The manufacturing method of the cartridge may be arranged as follows.

Instead of the fixing step utilizing thermal caulking, a fixing step utilizing another method (e.g., welding) may be executed.

The steps in the manufacturing method of the circuit board and the manufacturing method of the cartridge according to the present invention may be executed by a manufacturing apparatus or by an operator.

In addition to the above, within the scope of the claims, the components of the circuit board unit and the components of the cartridge may be suitably changed, and another component may be added or at least one of the components may be omitted.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A circuit board unit attachable to a cartridge, comprising:

a circuit board on which an electronic component is mounted;

a first member having a surface opposing the circuit board; and a second member which is bonded to a region of the surface, the region being different from a region of the surface opposing the circuit board, the circuit board being not fixed to the first member and the second member and being retained between the first member and the second member with gaps extending in an orthogonal direction orthogonal to the surface and in a surface direction in parallel to the surface, the first member has a protrusion protruding in the orthogonal direction, the circuit board has a through hole that the protrusion penetrates and is larger in size than the protrusion when viewed in the orthogonal direction, and the second member has a hole that receives a part of the protrusion.

2. The circuit board unit according to claim 1, wherein, the second member is bonded to the first member by at least one of welding, thermal caulking, and screwing.

3. The circuit board unit according to claim 2, wherein, the second member is bonded to the first member by ultrasonic welding.

4. The circuit board unit according to claim 1, wherein:

the protrusion penetrates the through hole, thus allowing the circuit board to move in the surface direction within a predetermined range, the electronic component is mounted on an opposing surface of the circuit board which surface opposes the first member, a region of the surface of the first member which region opposes the electronic component is arranged to be a hole so that the region does not contact the electronic component, and the hole of the first member is positioned and sized so that the electronic component opposes the hole of the first member irrespective of the movement of the circuit board in the surface direction within the predetermined range.

5. The circuit board unit according to claim 4, wherein, the hole of the first member is a through hole penetrating the first member.

6. A method of manufacturing a circuit board unit attachable to a cartridge, comprising the steps of:

(i) moving a circuit board, on which an electronic component is mounted, to oppose a surface of the first member, the first member having a protrusion protruding in an orthogonal direction orthogonal to the surface and in a surface direction in parallel to the surface, and mounting the circuit board on the surface such that the protrusion penetrates a through hole in the circuit board that is larger in size than the protrusion when viewed in the orthogonal direction; and (ii) after the step (i), bonding a second member to a region of the surface such that a hole in the second member receives a part of the protrusion, the region being different from a region of the surface opposing the circuit board, in the step (ii), the circuit board being retained between the first member and the second member with gaps extending in the orthogonal direction, and in the steps (i) and (ii), the circuit board being not fixed to the first member and the second member.

7. The method according to claim 6, wherein, in the step (ii), the gaps are formed along the entirety of an outer periphery of the circuit board in the surface direction.

8. The method according to claim 6, wherein, in the step (ii), the second member is bonded to the first member by at least one of welding, thermal caulking, and screwing.

9. The method according to claim 8, wherein, in the step (ii), the second member is bonded by ultrasonic welding.

10. The method according to claim 9, wherein, in the step (ii), a generator generating ultrasonic waves is provided on a surface of the second member which surface is opposite to a surface bonded to the surface of the first member, whereas a receiver that receives the ultrasonic waves generated by the generator is provided at a position on a surface of the first member which is opposite to the surface opposing the circuit board, the position opposing the second member over the first member but not opposing the circuit board over the first member.

11. A cartridge comprising:

a housing that defines a storing space; and a circuit board unit attached to the housing, the circuit board unit including:

a circuit board on which an electronic component is mounted;

a first member having a surface opposing the circuit board; and a second member which is bonded to a region of the surface of the first member, the region being different from a region of the surface opposing the circuit board, the circuit board being not fixed to the first member and the second member and being retained between the first member and the second member with gaps extending in an orthogonal direction orthogonal to the surface and in a surface direction in parallel to the surface, the housing having a groove that receives an outer periphery of the first member in the surface direction and including a first housing and a second housing which is attached to the first housing so as to define the storing space with the first housing, a first groove which is a part of the groove being formed on the first housing, and a second groove which is apart of the groove different from the first groove being formed on the second housing.

12. The cartridge according to claim 11, wherein, the first member has a protruding portion protruding in the surface direction, the first housing has a through hole penetrated by the protruding portion, and the first member is fixed to the first housing by thermally caulking the protruding portion penetrating the through hole.

13. The cartridge according to claim 11, wherein, the electronic component includes terminals on the cartridge that are aligned on the circuit board in two alignment directions with different densities and contact terminals on a main body to which the cartridge is attached, the two alignment directions include a low-density alignment direction and a high-density alignment direction in which the terminals on the cartridge are aligned with a higher density than the terminals aligned in the low-density alignment direction, the housing includes a concave portion through which the terminals on the cartridge are exposed and a peripheral wall defining the concave portion, the peripheral wall includes an orthogonal part extending in the orthogonal direction and an inclined part which is away from the circuit board in the orthogonal direction as compared to the orthogonal part and is inclined with respect to the orthogonal direction so that the concave portion increases in size when viewed in the orthogonal direction, the orthogonal part includes partial orthogonal parts that are different in length from one another the orthogonal direction, and among the partial orthogonal parts, partial orthogonal parts that are provided to sandwich the terminals on the cartridge in the high-density alignment direction are the longest.

14. The cartridge according to claim 13, wherein, the low-density alignment direction is a direction of the gray when the cartridge is attached to the main body.

15. The cartridge according to claim 13, wherein, the partial orthogonal parts formed on the first housing are identical in length and the partial orthogonal parts formed on the second housing are identical in length, and the partial orthogonal parts formed on the first housing are different in length from the partial orthogonal parts formed on the second housing.

16. A method of manufacturing a cartridge, the cartridge including:

a housing that defines a storing space; and a circuit board unit attached to the housing, the circuit board unit including:

a circuit board on which an electronic component is mounted;

a first member having a surface opposing the circuit board; and a second member which is bonded to a region of the surface of the first member, the region being different from a region of the surface opposing the circuit board, the circuit board being not fixed to the first member and the second member and being retained between the first member and the second member with gaps extending in an orthogonal direction orthogonal to the surface and in a surface direction in parallel to the surface, the housing having a groove that receives an outer periphery of the first member in the surface direction and including a first housing and a second housing which is attached to the first housing so as to define the storing space with the first housing, a first groove which is a part of the groove being formed on the first housing, and a second groove which is a part of the groove different from the first groove being formed on the second housing, the method comprising the steps of:

(I) causing a part of the outer periphery of the first member of the circuit board to be received by the first groove of the first housing; and (II) after the step (I), attaching the second housing to the first housing and causing parts of the outer periphery of the first member of the circuit board other than the part received by the first groove to be received by the second groove of the second housing.

17. The method according to claim 16, further comprising the steps of:

(III) in the step (I), causing a protruding portion formed on the first member to protrude in the surface direction to penetrate a through hole made through the first housing; and (IV) after the step (II), fixing the first member to the first housing by thermally caulking the protruding portion penetrating the through hole.

* * * * *